(12) United States Patent
Yuan

(10) Patent No.: US 7,053,673 B1
(45) Date of Patent: May 30, 2006

(54) VERSATILE CHARGE SAMPLING CIRCUITS

(75) Inventor: Jiren Yuan, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 72 days.

(21) Appl. No.: 09/672,803

(22) Filed: Sep. 28, 2000

(30) Foreign Application Priority Data

Sep. 28, 1999 (SE) ............................................. 9903532

(51) Int. Cl.
*G11C 27/02* (2006.01)

(52) U.S. Cl. ...................................................... 327/91
(58) Field of Classification Search .................. 327/91, 327/93, 94, 103, 336, 557; 341/122, 123
See application file for complete search history.

(56) References Cited

U.S. PATENT DOCUMENTS

| 5,281,860 | A | * | 1/1994 | Krenik et al. ................ 327/336 |
| 5,414,311 | A |   | 5/1995 | Carley |
| 5,698,999 | A |   | 12/1997 | Etoh et al. |
| 6,157,331 | A | * | 12/2000 | Liu et al. ..................... 341/118 |
| 6,181,748 | B1 | * | 1/2001 | Lin et al. ..................... 327/126 |
| 6,225,837 | B1 | * | 5/2001 | Goumaz ........................ 327/91 |
| 6,320,459 | B1 | * | 11/2001 | McCullough ................ 327/556 |

FOREIGN PATENT DOCUMENTS

| DE | 3634637 A1 | 4/1987 |
| EP | 0741391 A2 | 11/1996 |
| JP | 6236698 | 8/1994 |
| JP | 10163912 | 6/1998 |
| WO | WO 9610827 A1 | 4/1996 |

* cited by examiner

*Primary Examiner*—My-Trang Nu Ton
(74) *Attorney, Agent, or Firm*—Potomac Patent Group PLLC

(57) ABSTRACT

A charge sampling circuit, having a control signal generator for controlling an analog input signal to the charge sampling circuit to be integrated by an integrator during a sampling phase responsive to a sampling signal from the control signal generator is presented. The current of the analog input signal is integrated to an integrated charge for producing one of a proportional voltage and current sample at a signal output at the end of the sampling phase.

30 Claims, 16 Drawing Sheets

Note: 1. $f_c$=1000 MHz.
2. I in solid line and Q in dash line.

Note: 1. Ideal curve in solid line.
2. HSPICE simulation in dots.

Note: 1. Ideal curve in solid line.
2. HSPICE simulation in dots.

Note: 1. Ideal curve in solid line.
2. HSPICE simulation in dots.

ized archi-
VERSATILE CHARGE SAMPLING CIRCUITS

BACKGROUND

This application claims priority under 35 U.S.C. §§119 and/or 365 to 9903532-1 filed in Sweden on Sep. 28, 1999; the entire content of which is hereby incorporated by reference.

Voltage sampling is traditionally used for analog-to-digital (A/D) conversion. In a voltage sampler, a sampling switch is placed between a signal source and a capacitor. Between two sampling moments, the capacitor voltage tracks the signal voltage accurately. At the sampling moment, the switch is turned off to hold the capacitor voltage. The two processes become increasingly difficult when the signal frequency increases. For a given accuracy, thermal noise and switching noise set a minimum allowable capacitance while the tracking speed set a maximum allowable capacitance or switch resistance. It becomes impossible when the maximum is smaller than the minimum. Moreover, the clock jitter and finite turning-off speed (nonzero sampling aperture) make the sampling timing inaccurate. In fact, the bandwidth of a voltage sampling circuit must be much larger than the signal bandwidth. This makes direct sampling of high frequency radio signal extremely difficult. Sub-sampling can reduce the sampling rate but not the bandwidth of the sampling circuit and not the demands on small clock jitter and small sampling aperture.

SUMMARY

The object of the invention is to provide an improved sampling circuit and a method of sampling an analog signal, which overcomes the above mentioned problems.

In order to achieve said object the invention provides a charge sampling (CS) circuit, comprising a control signal generator for controlling an analog input signal to the charge sampling circuit to be integrated by an intergrator during a sampling phase responsive to a sampling signal from the control signal generator, wherein the current of the analog input signal is integrated to an integrated charge for producing a proportional voltage or current sample at a signal output at the end of the sampling phase.

A more specific object of the invention is to provide a method and sampling circuit for band-pass sampling.

This object is achieved by a band-pass sampling (BPCS) circuit, comprising a control signal generator for controlling a first and second end of a differential analog signal to be weighted by a weighting-and-sampling (W&S) element during a W&S phase responsive to a W&S signal from the control signal generator, wherein the current of the analog signal passes through said W&S element only when said W&S signal is in a W&S phase, and said control signal generator is adapted for controlling the output signal of the W&S element to be integrated by an intergrator during the W&S phase, wherein the current of the output signal of the W&S element is integrated to an integrated charge for producing a proportional voltage or current sample at a signal output at the end of the W&S phase.

Another more specific object of the invention is to provide a two-step BPCS circuit. This is achieved by a two-step BPCS circuit according to the invention, which comprises a first BPCS circuit according to the invention for producing signal samples with a first sample rate; a chopping circuit for chopping the signal from the first BPCS circuit symmetrically in time at its signal output or output pair with the frequency of a clock signal equal to the first sample rate; a differential-out amplifier for amplifying the signal from the chopping circuit differentially; wherein the first signal input and the second signal input of said second BPCS are connected to the signal output pair of said amplifier for producing signal samples at the signal output or output pair with a second sample rate.

A further specific object of the invention is to provide a front-end sampling radio receiver. This is obtained by a front-end sampling radio receiver according to the invention, which comprises a low pass filter with a bandwidth up to twice the clock frequency for receiving and filtering a radio signal; a low noise amplifier for producing a differentially amplified radio signal from the filtered signal; a local oscillator for producing an I-clock signal at its signal output; a π/2 phase shifter with a signal input connected to the local oscillator for producing a Q-clock signal at its signal output with the same amplitude and π/2 phase shift with respect to the I-clock signal; wherein two ends of the signal output pair of said low noise amplifier are respectively connected both to the first BPCS circuit and the second BPCS circuit respectively, said I-clock signal output is connected to the clock input of said first BPCS circuit, and the Q-clock signal output is connected to the clock input of the second BPCS circuit, for producing base-band I-samples of the radio signal at the signal output or output pair of the first BPCS circuit, base-band Q samples of the radio signal at the signal output or output pair of said second BPCS circuit.

An advantage of the charge sampling circuit according to the invention is that the bandwidth of the charge sampling circuit does not have to be much larger than the signal bandwidth. It is also important that for a radio signal, no matter how high the carrier frequency is, the signal bandwidth (the base band) remains a small fraction of the full bandwidth between DC carrier frequency. It is therefore unnecessary to convert the full bandwidth. Instead, it is only necessary to convert the bandwidth comprising the signal.

The frequencies of the signals possibly to be sampled by the CS circuits or the BPCS circuits are higher or much higher than that of the voltage sampling circuits at a given accuracy.

The sampling capacitors used in the CS circuits or the BPCS circuits are larger or much larger than the ones used in the voltage sampling circuits, giving advantages of low noise and low clock-and-charge feed-through.

Each BPCS circuit is simultaneously a filter, a mixer and a sampler, which greatly simplifies a radio receiver.

The BPCS circuits are capable of directly working at the radio frequency band, which makes a highly digitized radio receiver with front-end sampling and A/D conversion possible.

Both the center frequency and the bandwidth of a BPCS circuit can be easily programmed. The bandwidth can be as narrow as required; equivalent to having an unlimited Q-value.

The CS and BPCS circuits are simple and can be easily implemented in CMOS or other processes.

This technique is very useful for the purpose of system-on-chip, which requires a simple and highly digitized architecture.

It should be emphasised that the term "comprises/comprising" when used in this specification is taken to specify the presence of stated features, integers, steps or components and does not preclude the presence or addition of one or more other features, integers, steps, components or groups thereof.

BRIEF DESCRIPTION OF THE DRAWINGS

In order to explain the invention in more detail and the advantages and features of the invention a preferred embodiment will be described in detail below, reference being made to the accompanying drawings, in which FIG. 6A is the ideal frequency response of a constant-weighting BPCS circuit according to the invention with n=10.

DETAILED DESCRIPTION

The present invention is a charge sampling (CS) circuit or a band-pass charge sampling (BPCS) circuit, sampling a signal by integrating its current in a given time window, and the resulting charge represents the signal sample at the center time of the window.

Figure 1A:
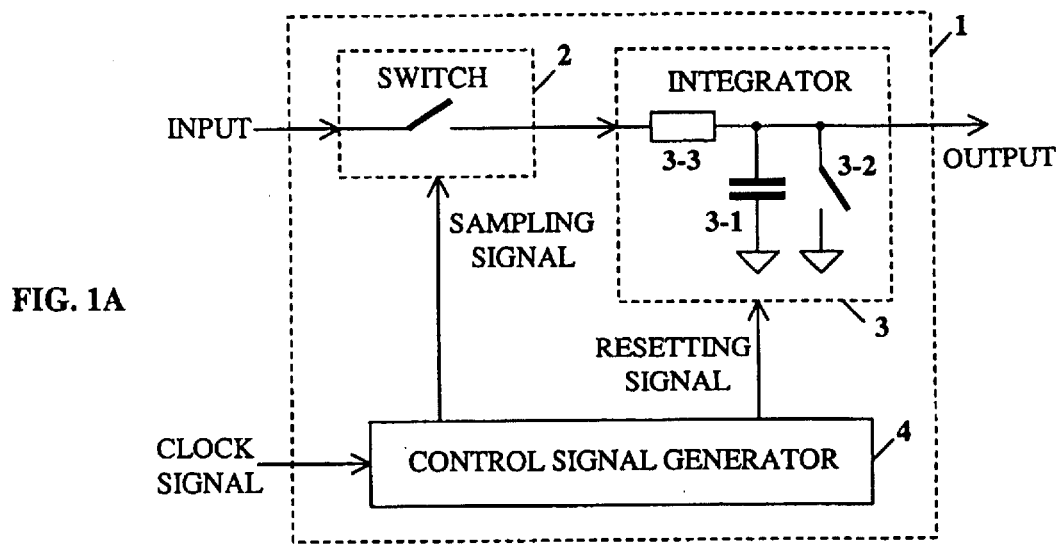
FIG. 1A is a block diagram of a first embodiment of a charge sampling (CS) circuit according to the invention.

With reference to FIG. 1A, a first embodiment of a charge sampling (CS) circuit 1 according to the invention is shown. It comprises sampling switch 2, an integrator 3 and a control signal generator 4. The switch 2 has a signal input, a signal output and a control input. An analog signal is applied to the signal input of the switch, which is the signal input of the charge sampling circuit 1, and a sampling signal is applied to the control input from the control signal generator 4. The switch is on, i.e the signal input is connected to the signal output of the switch, only when the sampling signal is in the sampling phase. The integrator 3 has a signal input, a signal output, and a control input. The signal output of the switch 2 is applied to the signal input of the integrator 3, and a resetting signal from the control signal generator 4 is applied to the control input of the integrator 3. The current of the analog input signal to the CS circuit 1 is integrated during the sampling phase, and the integrated charge produces a proportional voltage or current sample at the signal output of the CS circuit at the end of the sampling phase. The sample is held until the resetting phase of the resetting signal begins, and the time interval in between is the holding phase. A sequence of samples are produced when the phases are repeated, and the signal output is the signal output of said CS circuit. The control signal generator 4 has a clock input, which is the clock input of the CS circuit, a sampling signal output connected to the control input of the switch 2 and a resetting signal output connected to the control input of the integrator 3 as mentioned above.

Figure 1B:
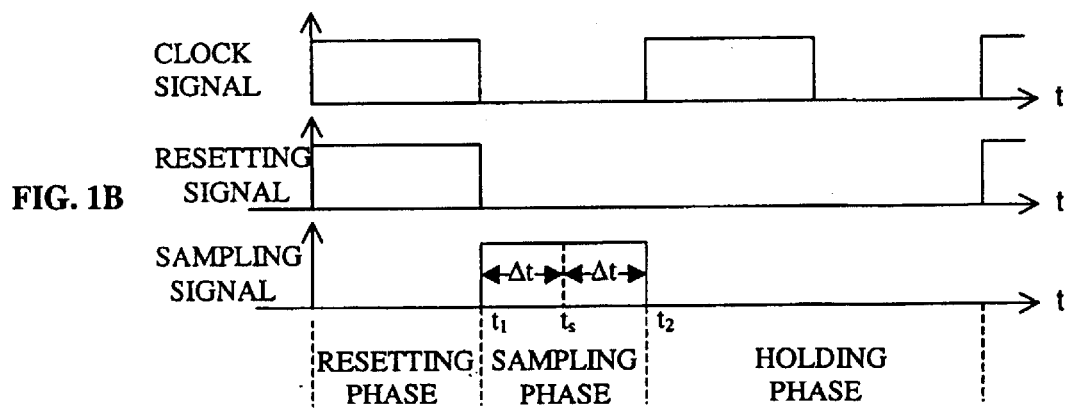
FIG. 1B shows the working waveforms of the charge sampling (CS) circuit in FIG. 1A.

The integrator 3 comprises a capacitor 3-1, a resetting switch 3-2 and an optional resistor 3-3 in this embodiment. The integrator 3 can, however, have a different configuration in other embodiments. An analog signal is applied to the input of the sampling switch 2. As described, the charge sampling process involves three successive phases: resetting, sampling ($t_1$ to $t_2$) and holding. The time from $t_1$ to $t_2$ is defined as the sampling window. FIG. 1B shows its working waveforms. During the resetting phase, only the resetting switch 3-2 is turned on and the capacitor 3-1 is reset. During the sampling phase, only the sampling switch 2 is turned on, and the signal current is integrated onto the capacitor 3-1. The time constant is large enough to be able to obtain a linear charging when the signal comes from a voltage source (the usual case). If the on-resistance of the switch 2 is too small, the optional resistor 3-3 can be added. During the holding phase, both switches are in off-state, and the output voltage of the integrator 3 is held for further use. A pair of interconnected CS circuits, forming a differential CS circuit, provide differential outputs to cancel common mode effects, using a differential input signal and sharing the control signal generator 4. The CS circuits or circuit pairs are used in parallel to increase the sampling rate and to make the time interval between two sampling points possibly less than the sampling window, by time-interleaving both sampling and resetting signals. The signal current can be represented as $I(t)=\Sigma I_i \sin(\omega_i t+\phi_i)$, i=1, 2, ..., m. The total integrated charge is $Q=\Sigma Q_i$ where $Q_i=(I_i/\omega_i)$ $(\cos(\omega_i t_1+\phi_i)-\cos(\omega_i t_2+\phi_i))$. If $t_s$ is the center time of the sampling window, and $2\Delta t=(t_2-t_1)$ is the window width, $Q_i=(2 \sin(\omega_i \Delta \omega_i)I_i \sin(\omega_i t_s+\phi_i)=2\Delta t(\sin(\omega_i \Delta t)/(\omega_i \Delta t))$ $I_i \sin(\omega_i t_s+\phi_i)$.

Figure 1C:
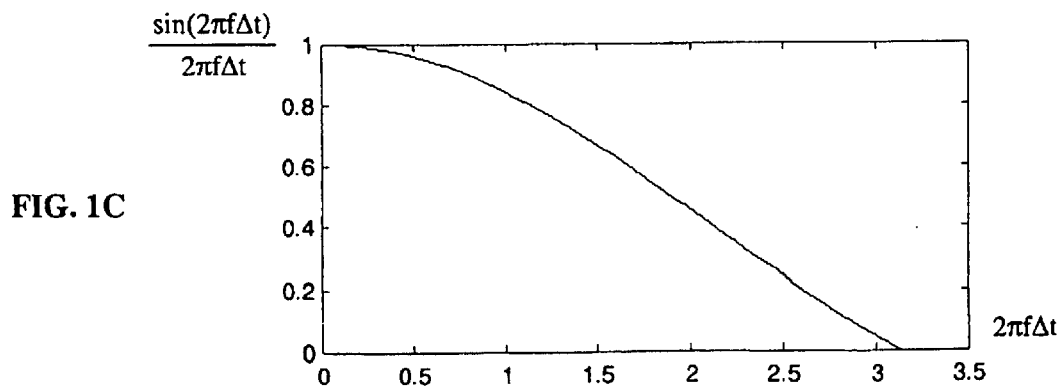
FIG. 1C shows the frequency response of the charge sampling (CS) circuit in FIG. 1A.

Compared with the instant value of the ith component at $t_s$, $I_i(t_s)=I_i \sin(\omega_i t_s+\phi_i)$, the difference is $k_i=2\Delta t(\sin(\omega_i \Delta t/\omega_i \Delta t))$, a sampling coefficient depending on frequency $\omega_i$ and $\Delta t$. With this coefficient, the ith frequency component has been precisely sampled at time $t_s$. Since all frequency components are sampled at $t_s$, the total charge on the capacitor naturally represents the signal sample at $t_s$, i.e. $t_s$ is the equivalent sampling time point. The frequency response of the CS circuit depends on the function $\sin(\omega_i \Delta t/\omega_i \Delta t)$, shown in FIG. 1C. Its 3 dB bandwidth equals $\Delta f_{3dB}=1.4/(2\pi\Delta t)$, i.e. 1 GHZ for a sampling window of 450 ps, independent of resolution. For voltage sampling, however, the sampling aperture must be smaller than 1 ps for an 8-bit resolution at 1 GHz. Since the function $\sin((\omega_i \Delta t/\omega_i \Delta t)$ is well defined, frequency compensation becomes possible. One way is to let the analog signal pass through a network with a frequency response of $(\omega_i \Delta t/\sin(\omega_i \Delta t)$ before sampling. Another alternative is to use digital signal processing (DSP) after A/D conversion to compensate the frequency response.

Further, a band pass charge sampling (BPCS) circuit comprises two switches, a weighting-and-sampling (W&S) element, an integrator, and a control signal generator generating a clock, an inverse clock, a W&S signal and a resetting signal. Two ends of a differential signal are applied to the two switch inputs respectively. The two switches, controlled by the clock and the inverse clock respectively, are turned on alternately. Both switch outputs are fed to the W&S element input. The output of W&S element is fed to the integrator input. It works in three successive phases: resetting, sampling and holding. During the resetting phase, the integrator is reset by the resetting signal. Each sampling phase includes n clock cycles, during which the signal current is weighted in the W&S element and integrated in the integrator. During the holding phase, the integrator output is held.

Figure 2A:
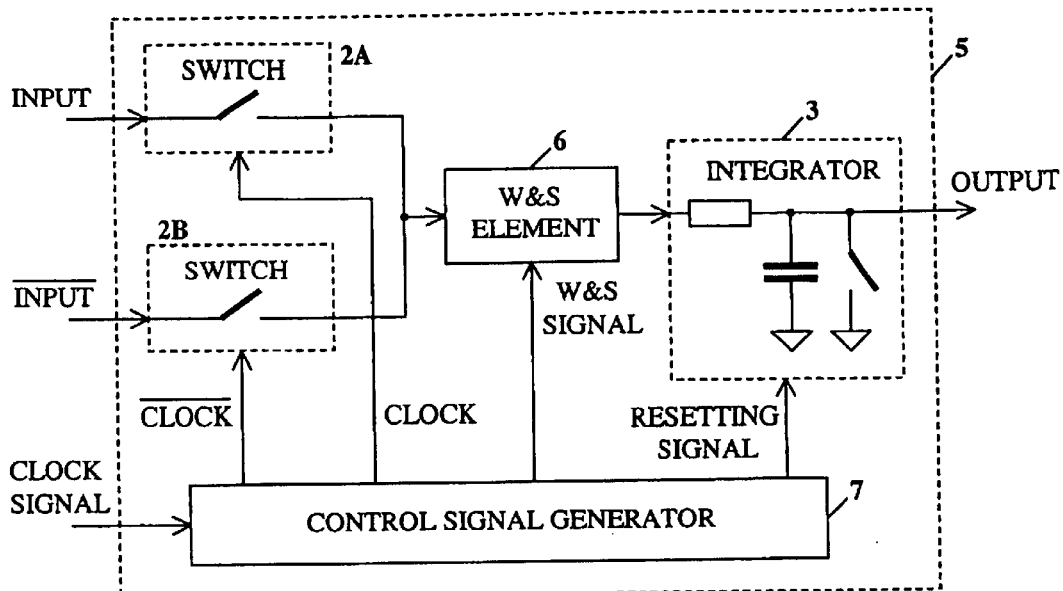
FIG. 2A is a block diagram of a first embodiment of a a band pass charge sampling (BPCS) circuit according to the invention.
Figure 2B:
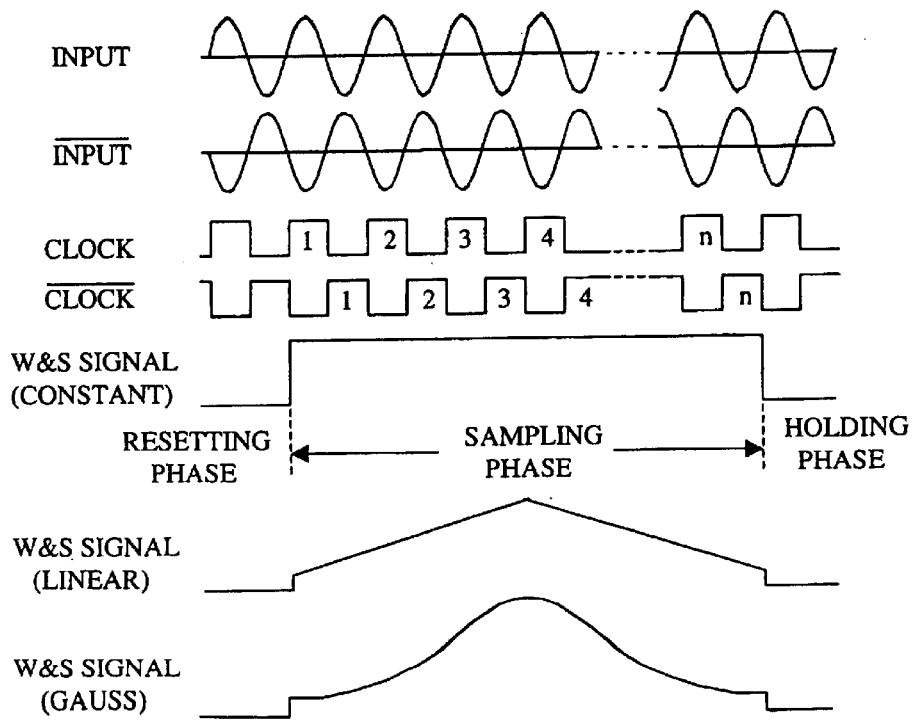
FIG. 2B shows the working waveforms of the band pass charge sampling (BPCS) circuit in FIG. 2A.

One embodiment of a band-pass charge sampling (BPCS) circuit 5 is shown in FIG. 2A. It comprises two switches 2A and 2B, a weighting-and-sampling (W&S) element 6, an integrator 3 and a control signal generator 7 generating a clock, an inverse clock, a W&S signal and a resetting signal. Two ends of a differential analog signal are applied to the inputs of switches 2A and 2B respectively. The switches 2A and 2B, controlled by the clock and the inverse clock respectively, are turned on alternately. Both outputs of switch 2A and 2B are fed to the input of W&S element 6. The current passing through the W&S element 6 is controlled by the W&G signal. The output of W&S element 6 is fed to the input of integrator 3. Three successive phases are involved for each BPCS process: resetting, sampling and holding. FIG. 2B shows the working waveforms. During the resetting phase, the integrator is reset. Each sampling phase includes n clock cycles forming a sampling window. The signal current through W&S element equals zero outside the sampling window and is weighted according to the weighting function (constant, linear, Gauss or other functions) within the sampling window. The weighting function depends on the combination of the W&S element 6 and the W&S signal. The three W&S signals shown in FIG. 2B, corresponding to the three weighting functions (constant, linear and Gauss) are specifically used for a W&S element in which the current is linearly controlled by the W&S signal. During the holding phase, the output voltage of integrator 3 is held for further use.

Figure 3:
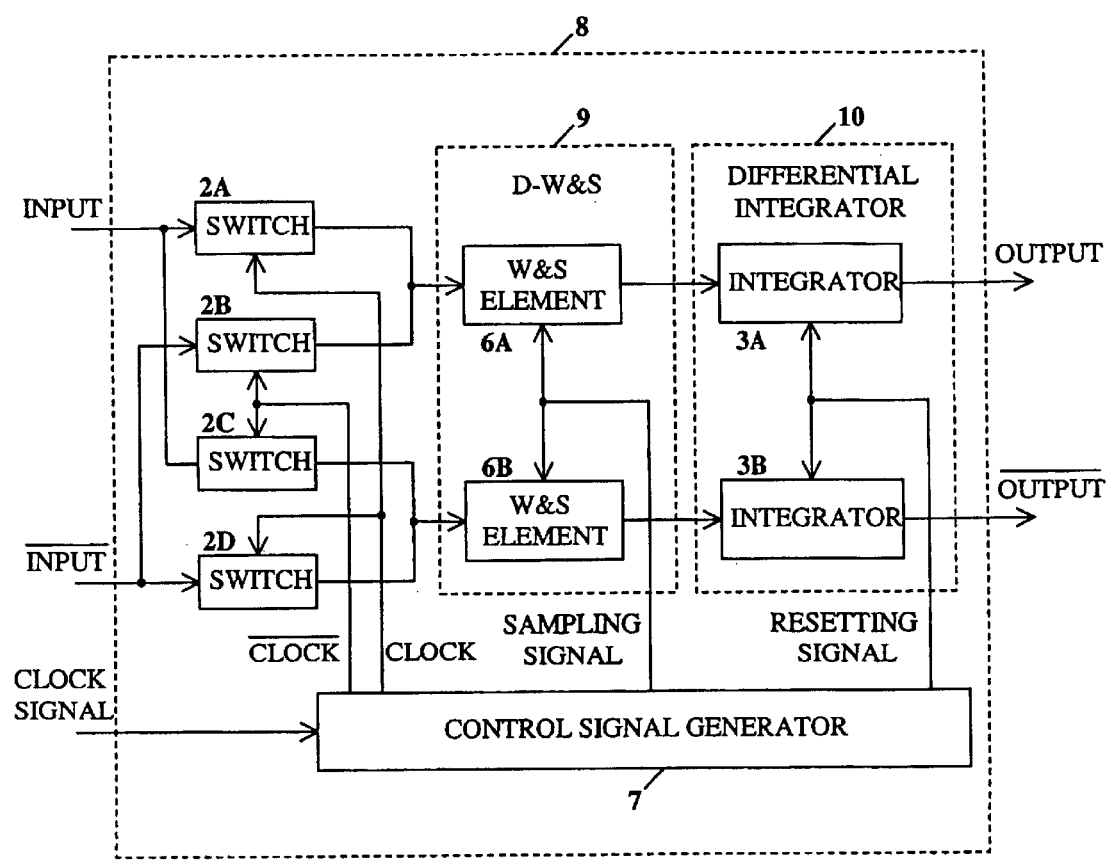
FIG. 3 is a block diagram of a first embodiment of a differential BPCS circuit according to the invention.

A differential BPCS circuit 8 is shown in FIG. 3. It comprises four switches 2A, 2B, 2C and 2D, a differential W&S (D-W&S) element 9, a differential integrator 10, and a control signal generator 7, as connected. The shown type of D-W&S element 9 comprises two parallel W&S elements 6A and 6B, and the shown type of differential integrator comprises two parallel integrators 3A and 3B. The D-W&S element 9 and the differential integrator 10 may be in other types. The differential BPCS circuit 8 works in the same way as the single ended BPCS circuit 5 except to produce two outputs differentially. The differential BPCS circuit 8 effectively cancels the common mode effects and gives more accurate results.

Figure 4:
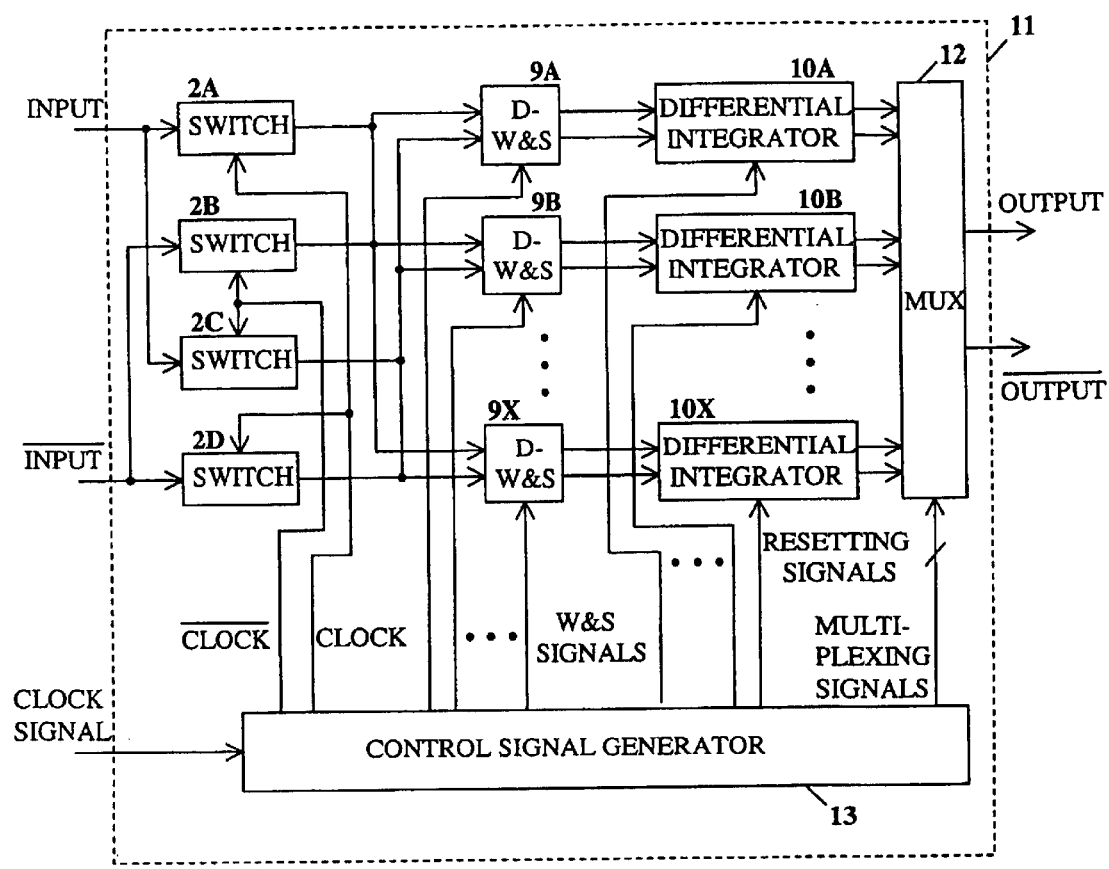
FIG. 4 is a block diagram of a first embodiment of a parallel differential BPCS circuit according to the invention

FIG. 4 shows a parallel differential BPCS circuit 11. It comprises four switches 2A, 2B, 2C and 2D, a number of D-W&S elements 9A, 9B, . . . , 9X, a number of differential integrators 10A, 10B, . . . , 10X, a multiplexer (MUX) 12 and a control signal generator 13, as connected. Each pair of the D-W&S element and the differential integrator, 9A+10A, 9B+10B, . . . , 9X+10X, together with the switches 2A, 2B, 2C and 2D work in the same way as the differential BPCS circuit 8. The W&S signals and the resetting signals to these pairs, generated by the control signal generator 13, are evenly time-interleaved. The MUX 12 multiplexes the outputs of the differential integrators 10A, 10B, . . . , 10X to the differential outputs when they are in the holding phase, controlled by the multiplexing signals from the control signal generator 13. As a whole, the parallel BPCS circuit gives a higher sampling rate and makes the time interval between two successive sampling points possibly less than the sampling window. If switches 2C and 2D are removed, and the differential W&S elements and the differential integrators are replaced by single-ended versions, it becomes a parallel single-ended BPCS circuit.

Figure 5:
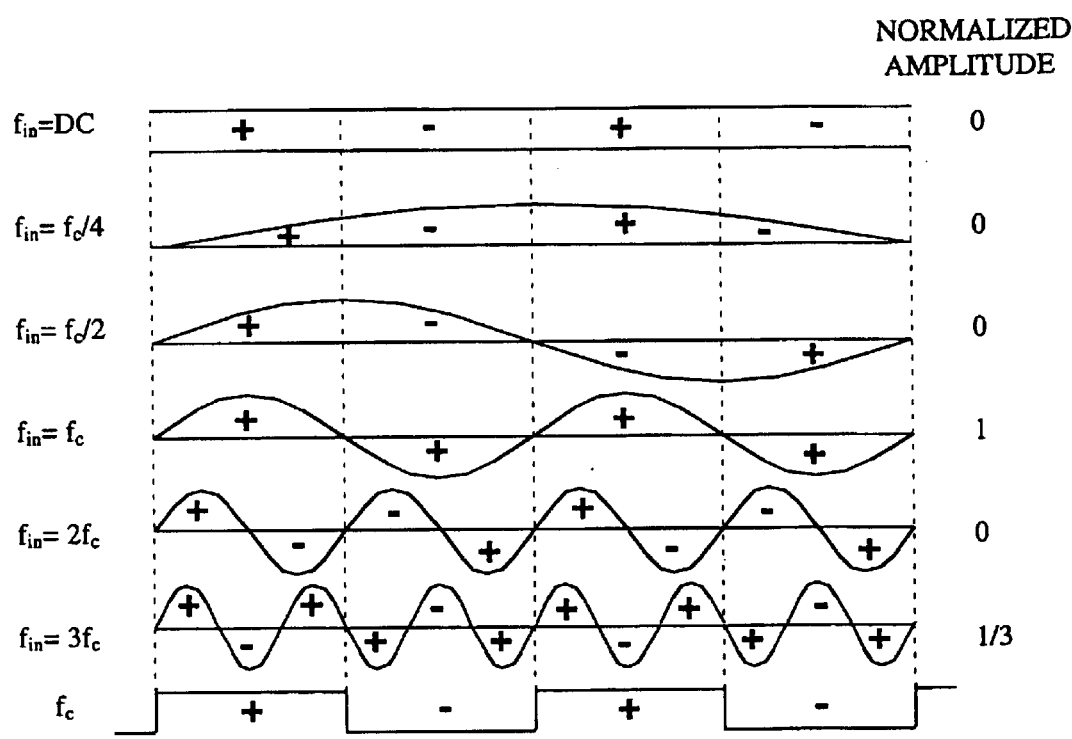
FIG. 5 shows an illustration of the filter function for the BPCS circuits according to the invention

A filter function of the BPCS circuits is illustrated in FIG. 5. From top-down, the frequency increases from DC to 3f, where $f_c$ is the clock frequency. Note that during the negative clock phase the same signal is connected oppositely, which is reflected in the diagram by changing the signal sign. The normalized amplitudes of resulting charges, i.e. the sums of the areas, integrated in n clock cycles are listed in FIG. 5 respectively. It is obvious that for input signals with frequencies much higher or lower than $f_c$, the charges cancel each other almost completely, resulting in nearly zero output. For input signals with certain frequencies like $f_c/4$, $f_c/2$, $2f_c$, . . . , the charges are completely cancelled no matter what their phases are. For input signals with frequencies near $f_c$, the charges are only partly cancelled. When $f_{in}=f_c$, the charges are fully added to each other if it is in-phase with $f_c$ while fully cancelled when it is in $\pi/2$ phase with $f_c$ (not shown in FIG. 5). There is a bandwidth in which the signal charges can be effectively integrated. Outside the bandwidth, the signal charges are either completely or substantially cancelled. This is obviously a filter function. It means that the noise with frequencies outside the bandwidth will be cancelled as well.

Figure 6B:
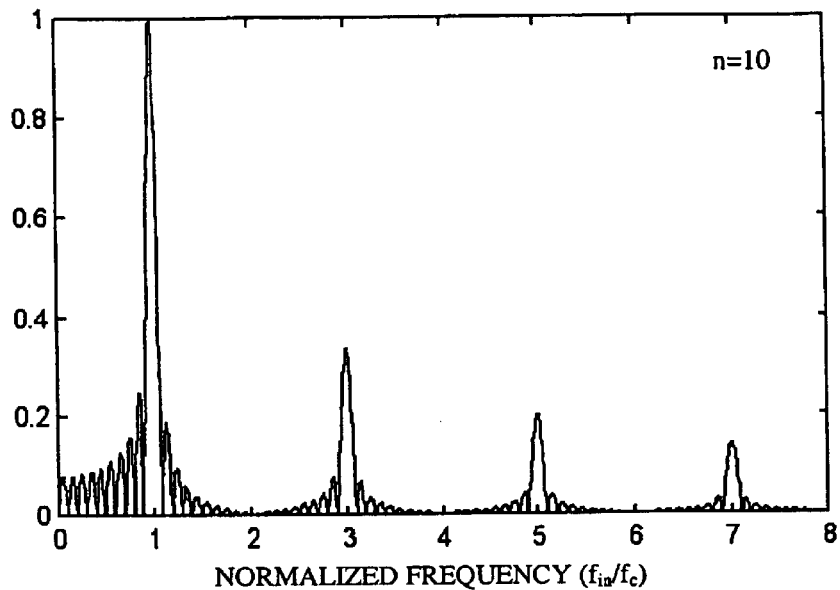
FIG. 6B is the output sample waveforms of a constant-weighting BPCS circuit with n=10.
Figure 6B:
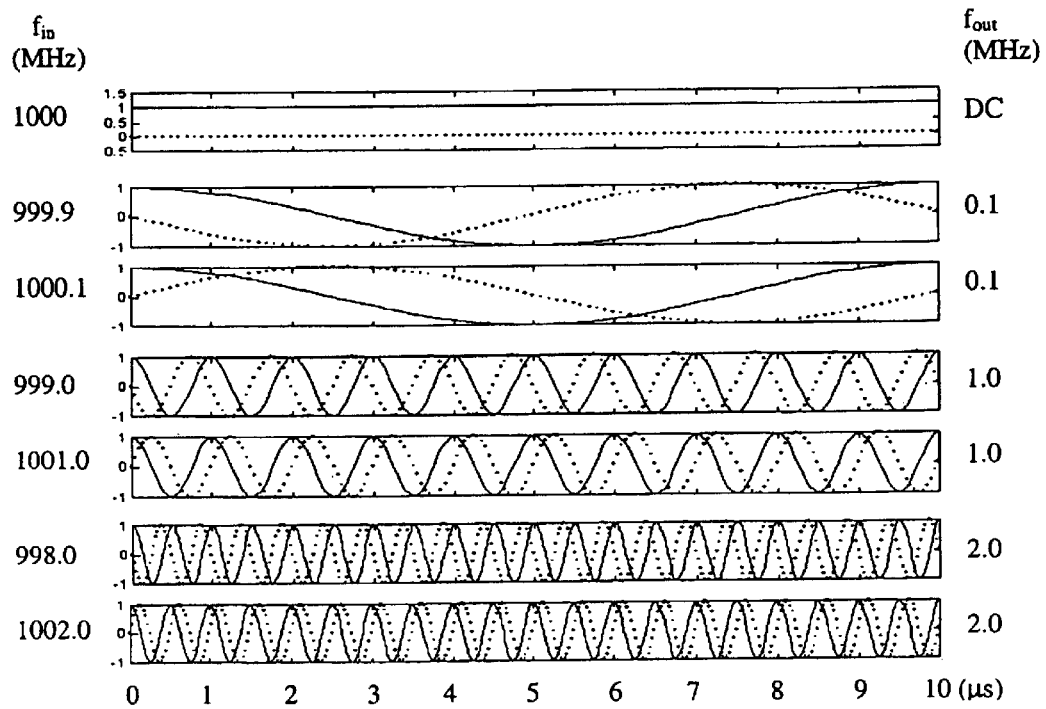

An ideal frequency response of a BPCS circuit is shown in FIG. 6A, which corresponds to a mathematically accurate integration of the signal current in the sampling window. In FIG. 6A, $n \leq 10$ and constant-weighting are assumed, meaning that the weight of the current is kept constant in the 10-clock-cycle sampling window. Further, FIG. 6A shows the frequency response from $f_{in}=0$ to $f_{in}=8f_c$, where the y-axis is the maximum output amplitude of different frequency components normalized by the maximum output amplitude in the whole frequency range while the x-axis is input frequencies normalized by $f_c$. It can be seen that the same frequency response is repeated after $f_{in}>2f_c$ but with lower amplitudes. The output frequency $f_{out}$ equals $|f_{in}-(2p-1)f_c|$ for $2(p-1)f_c \leq f_{in} \leq 2pf_c$, where p is an integer ($\geq 1$). When $f_{in}=(2p-1)f_c$, the output is a DC voltage, and its amplitude depends on the phase relation of $f_{in}$ and $f_c$. For a given p, the same output frequency is obtained for input frequencies $f_{in1}(<(2p-1)f_c)$ and $f_{in2}(>(2p-1)f_c)$ when $(2p-1)f_c-f_{in1}=f_{in2}-(2p-1)f_c$, but their phases are different. FIG. 6B shows the output sample waveforms at different input frequencies with $f_c=1000$ MHz and both I (solid line) and Q (dots) phases. It shows that the BPCS circuit is a filter, a mixer and a sampler simultaneously.

Figure 7A:
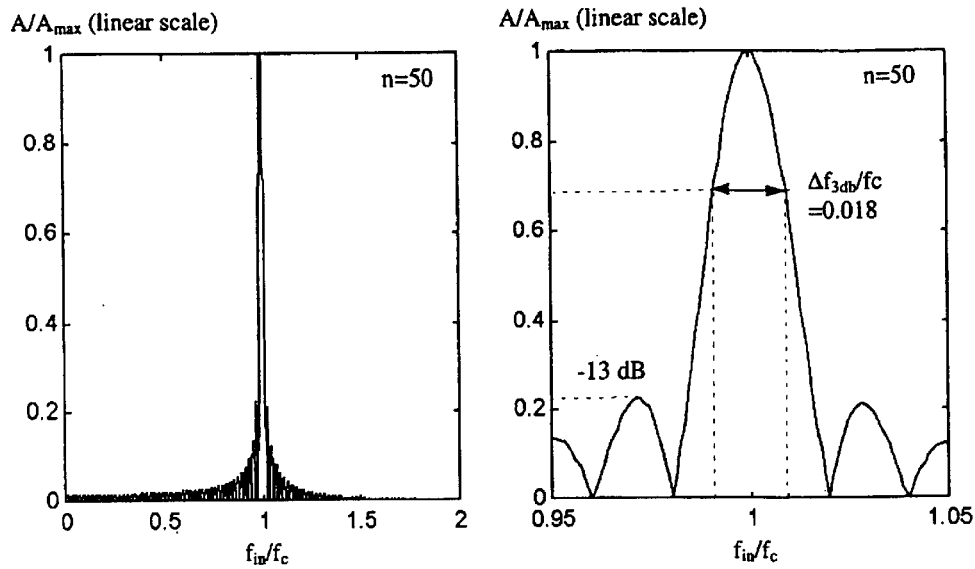
FIG. 7A is the ideal frequency responses of a constant-weighting BPCS circuit with n=50.
Figure 7B:
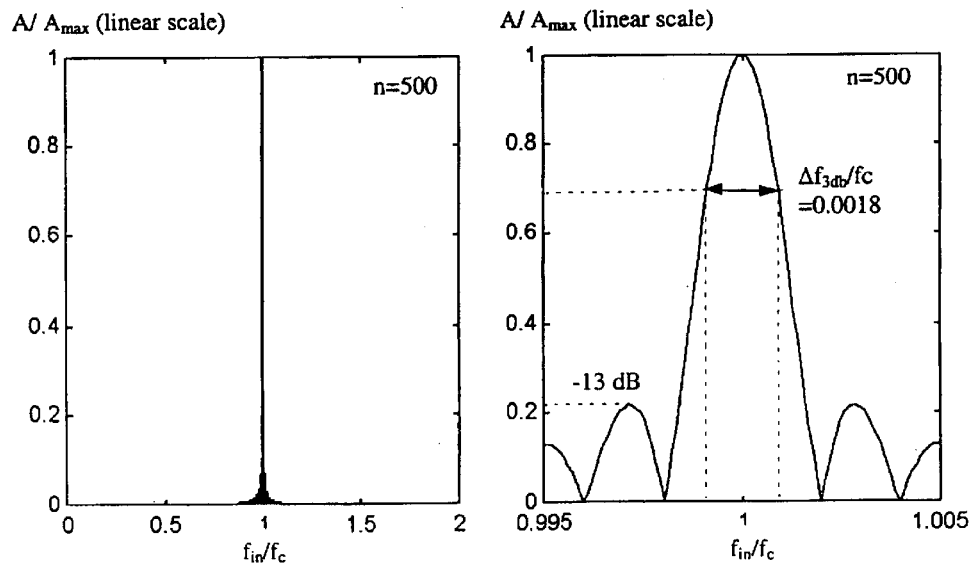
FIG. 7B is the ideal frequency responses of a constant-weighting BPCS circuit with n=500.

In FIG. 7A and FIG. 7B, the ideal frequency responses of a constant-weighting BPCS circuit with n=50 and n=500 are shown respectively. FIG. 7A shows the frequency response with n=50 in the range of $0<f_{in}<2f_c$ and in the fine range of $0.95f_c<f_{in}<1.05f_c$. FIG. 7B shows the frequency response with n=500 in the range of $0<f_{in}<2f_c$ and in the fine range of $0.995f_c<f_{in}<1.005f_c$. It can be seen that $\Delta f_{3dB}=0.018f_c$ with n=50 and $\Delta f_{3dB}=0.0018f_c$ with n=500, i.e. the bandwidth is inversely proportional to n. The amplitudes of far-end frequency components are reduced with the increase of n, but the maximum adjacent peaks in both cases remain almost unchanged; around −13 dB.

Figure 8A:
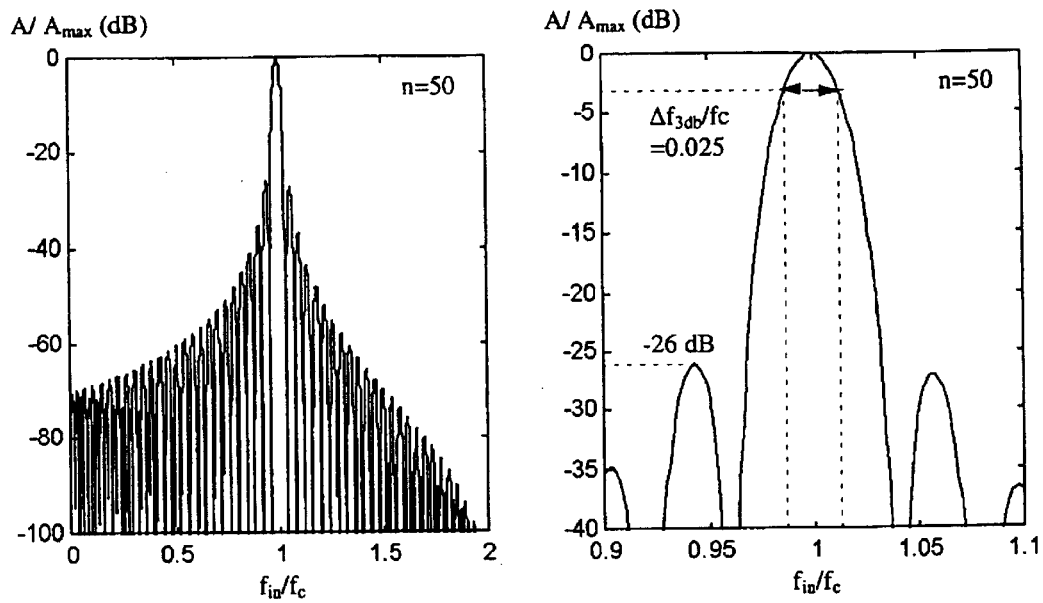
FIG. 8A is the ideal frequency responses of a linear-weighting BPCS circuit with n=50.
Figure 8B:
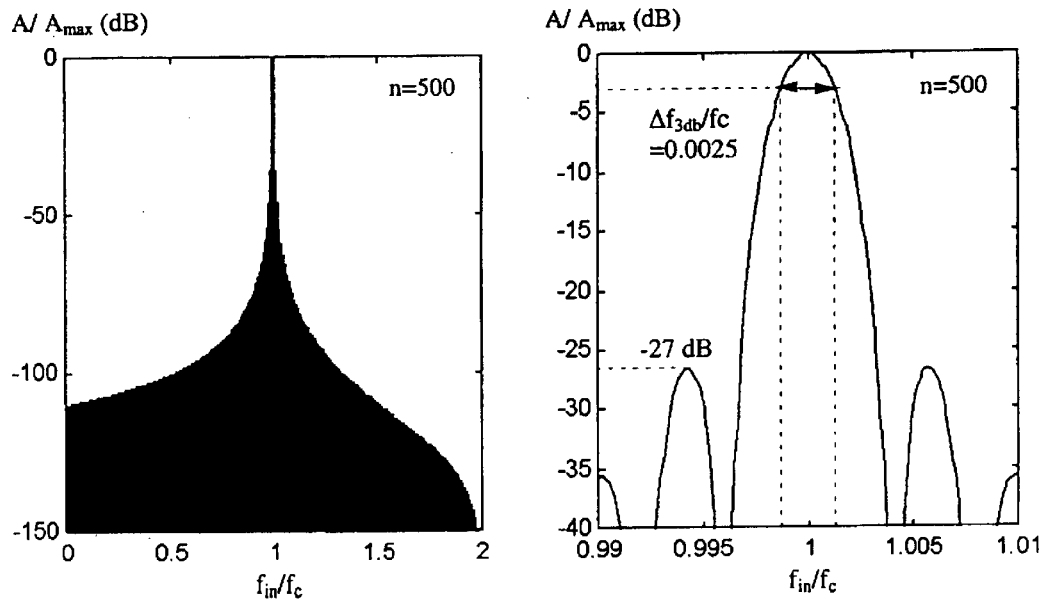
FIG. 8B is the ideal frequency responses of a linear-weighting BPCS circuit with n=500.

An ideal frequency responses of a linear-weighting BPCS circuit with n=50 and n=500 are shown in FIG. 8A and FIG. 8D, respectively. Linear-weighting means that during the sampling phase the weight of the current is first linearly increased and then linearly decreased, symmetric to the center of the sampling window. FIG. 8A shows the frequency response with n=50 in the range of $0<f_{in}<2f_c$ and in the fine range of $0.9f_c<f_{in}<1.1f_c$. FIG. 8B shows the frequency response with n=500 in the range of $0<f_{in}<2f_c$ and in the fine range of $0.99f_c<f_{in}<1.01f_c$. It can be seen that $\Delta f_{3dB}=0.025f_c$ with n=50 and $\Delta f_{3dB}=0.0025f_c$ with n=500, slightly increasing compared to the constant-weighting cases. The amplitudes of far-end frequency components are rapidly reduced with the increase of n. The maximum adjacent peaks are reduced to −26 dB and −27 dB respectively, compared to those of the constant-weighting cases.

Figure 9A:
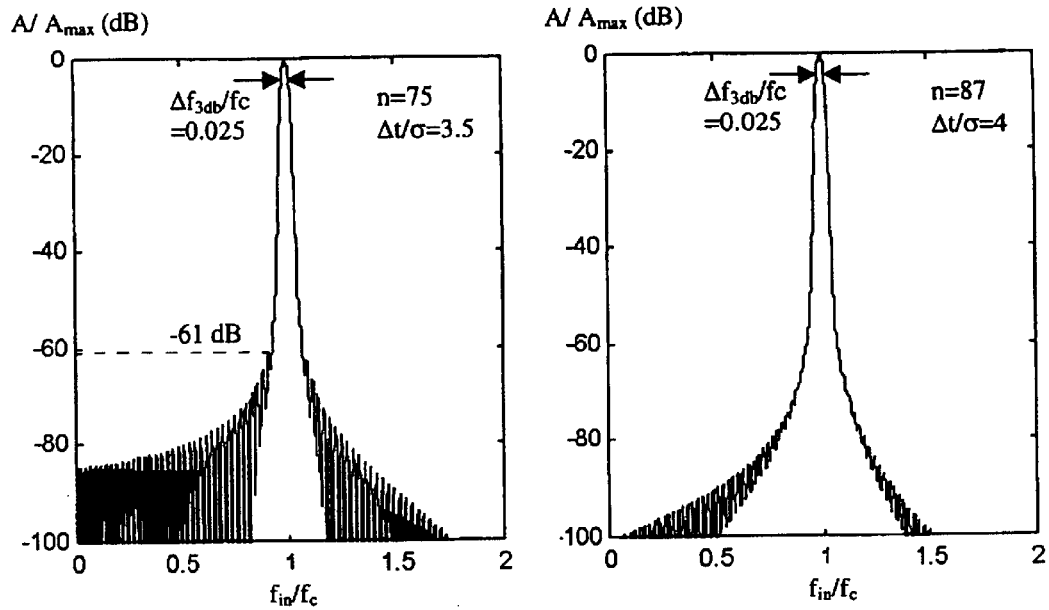
FIG. 9A is the ideal frequency responses of a Gauss-weighting BPCS circuit with n=75 and n=87.
Figure 9B:
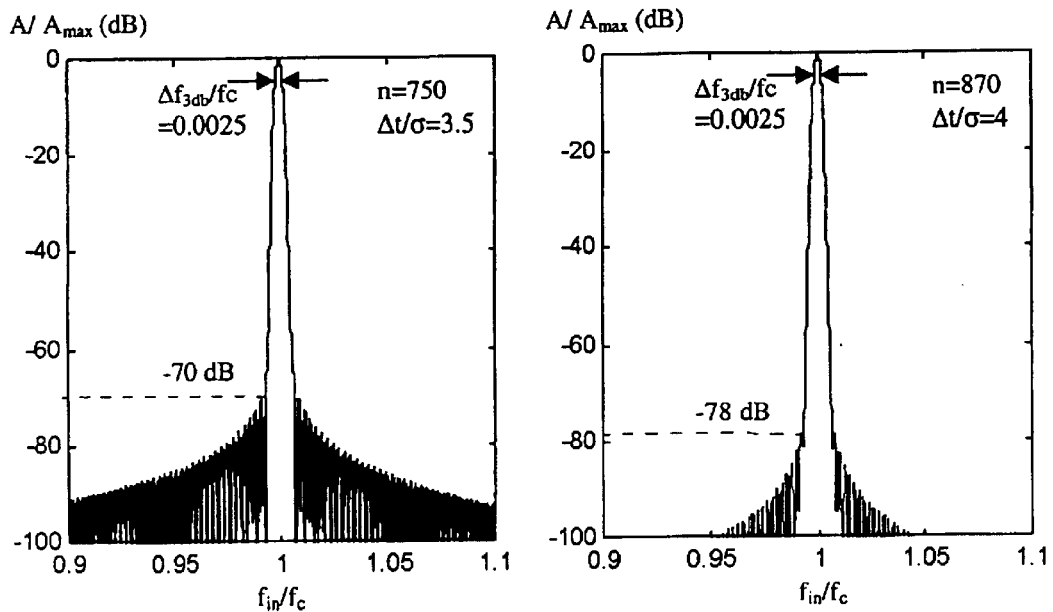
FIG. 9B is the ideal frequency responses of a Gauss-weighting BPCS circuit with n=750 and n=870.

In FIG. 9A and FIG. 9B, the ideal frequency responses of a Gauss-weighting BPCS circuit are shown. Gauss-weighting means that during the sampling phase the weight of the current varies according to the Gauss function $\exp(-t^2/2\sigma^2)$ for a given $\sigma$, symmetric to the center of the sampling window. The ratio $\Delta t/\sigma$, where $\Delta t$ is half of the sampling window and $\sigma$ the standard deviation, is a weighting parameter. FIG. 9A shows the frequency responses of n=75 with $\Delta t/\sigma=3.5$ and n=87 with $\Delta t/\sigma=4$ respectively in the range of $0<f_{in}<2f_c$. The 3 dB bandwidths are both $0.025f_c$. FIG. 9B shows the frequency responses of n=750 with $\Delta t/\sigma=3.5$ and n=870 with $\Delta t/\sigma 4$ respectively in the range of $0.9f_c<f_{in}<1.1\ f_c$ The 3 dB bandwidths are both $0.0025f_c$. The amplitudes of far-end frequency components and the adjacent peaks are substantially reduced with the Gauss-weighting. The maximum adjacent peaks are in the range of −61 dB to −78 dB.

Figure 10:
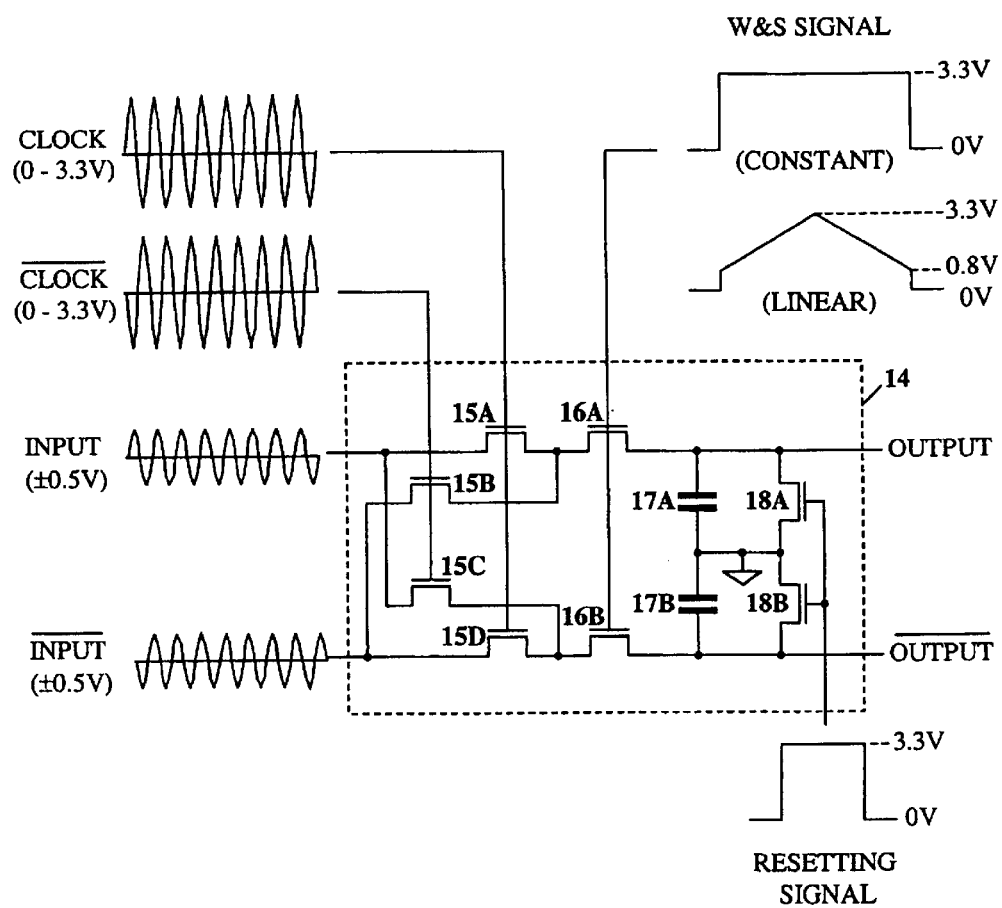
FIG. 10 is a circuit diagram of the first embodiment of the differential BPCS circuit in FIG. 3.

An implementation 14 of the core of the differential BPCS circuit 8, using n-MOS transistors, is shown in FIG. 10. The clocked switches are n-MOS transistors 15A, 15B, 15C and 15D. The W&S elements are n-MOS transistors 16A and 16B. The resetting switches are n-MOS transistors 18A and 18B. The capacitors are on-chip MOS capacitors 17A and 17B. The clocks are in sinuous waves but quasi-square waves can also be used. The implementation 14 works in all CMOS processes. Parameters of a 0.8 μm CMOS process, however, is used in the HSPICE® simulations. The following three implementations are based on the implementation 14 with particular component values and W&S signal parameters.

Figure 11A:
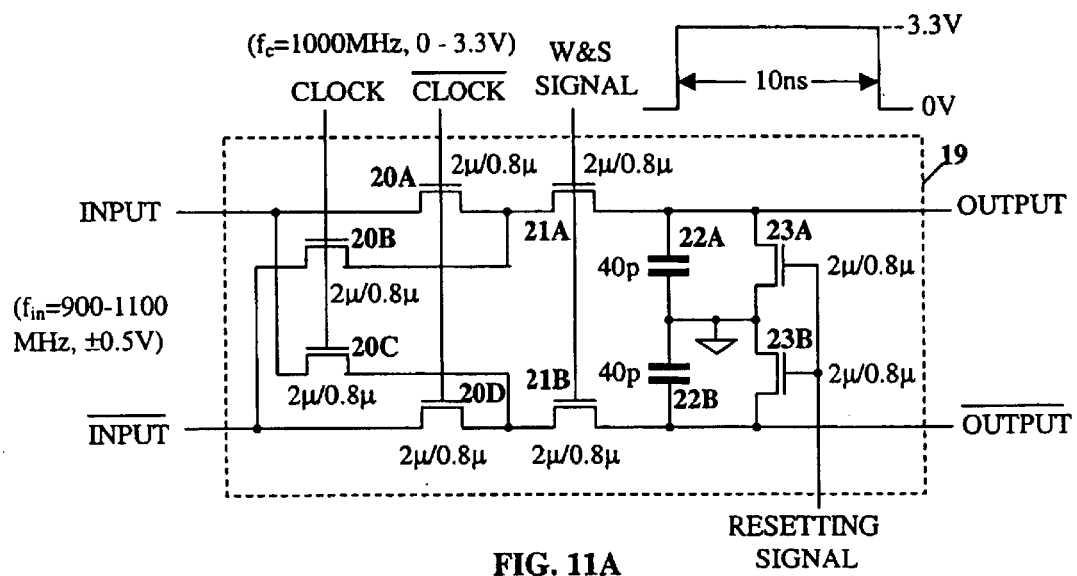
FIG. 11A shows the circuit diagram according to FIG. 10 with n=10 in constant weighting at 1000 MHz
Figure 11B:
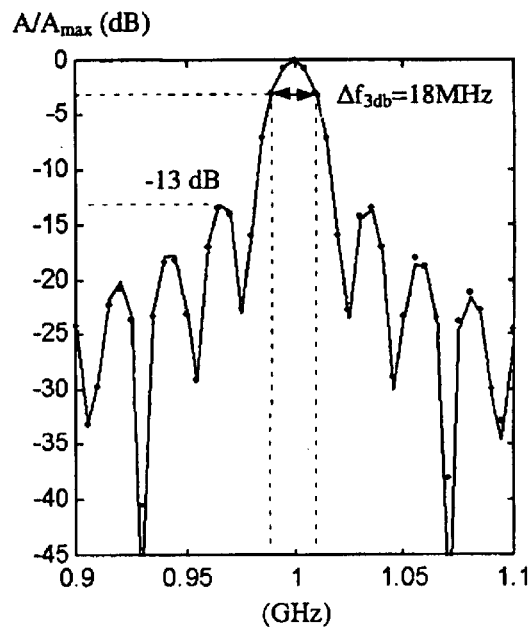
FIG. 11B shows the resulting frequency response of the circuit in FIG. 11A.

An implementation 19 with n=10 in constant-weighting at $f_c=1000$ MHZ is shown in FIG. 11A. The clocked switches are n-MOS transistors 20A, 20B, 20C and 20D. The W&S elements are n-MOS transistors 21A and 21B. The resetting switches are n-MOS transistors 23A and 23B. They all have the minimum size, 2 μm/0.8 μm (width/length). The capacitors are MOS capacitors 22A and 22B, both 40 pF. The width of the constant-weighting W&S signal is 10 ns, corresponding to n=10. The maximum differential output sample voltage is around 100 mV. FIG. 11B shows both the theoretical frequency response in solid line and the HSPICE® simulated frequency response in dots for $f_{in}=900$–1100 MHZ. The simulated frequency response is closely in accordance with the theoretical frequency response. In both cases, the maximum adjacent peaks are −13 dB and $\Delta f_{3dB}=18$ MHZ.

Figure 12A:
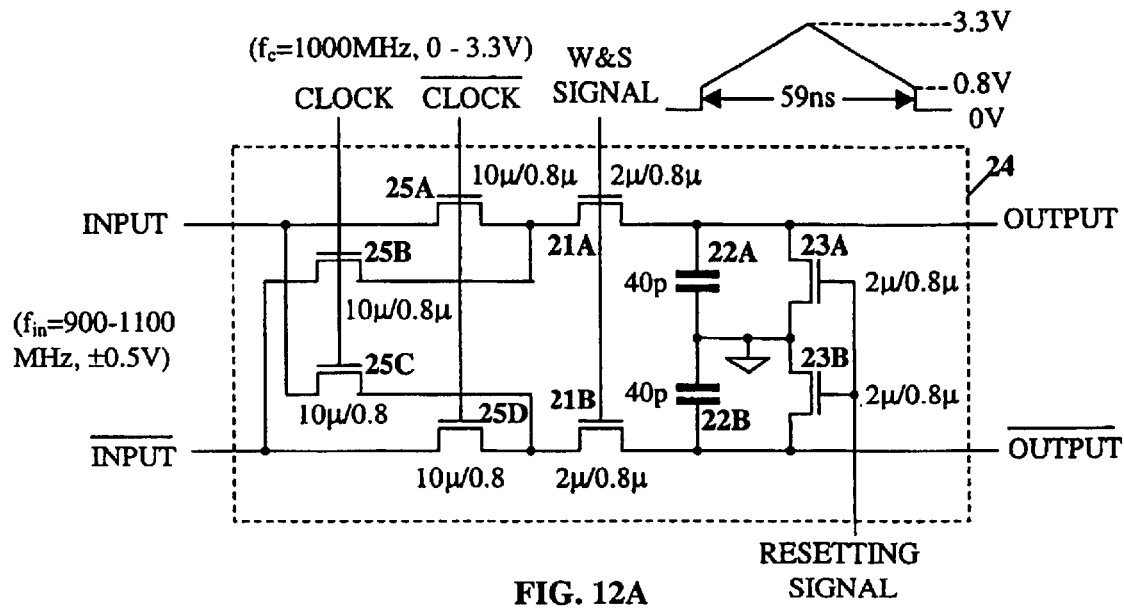
FIG. 12A is the circuit diagram according to FIG. 10 with n=59 in linear weighting at 1000 MHz.
Figure 12B:
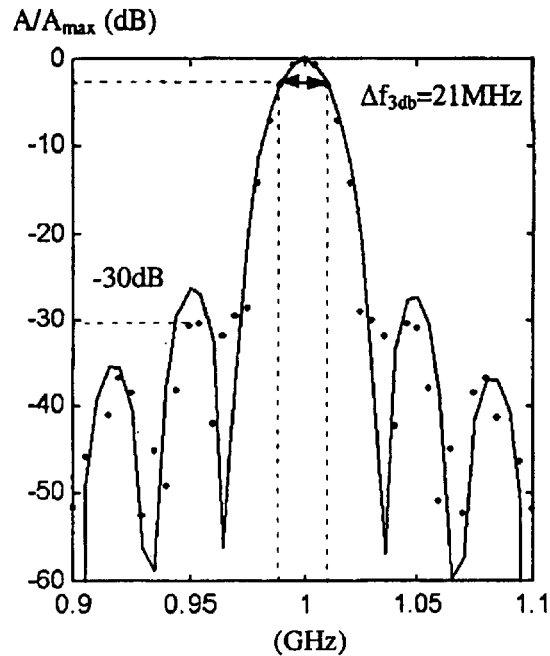
FIG. 12B is the resulting frequency response of the the circuit in FIG. 12A.

In FIG. 12A, an implementation 24 with n=59 in linear-weighting at $f_c=1000$ MHZ is shown. The clocked switches are n-MOS transistors 25A, 25B, 25C and 25D, all having an increased size of 10 μm/0.8 μm. This makes the signal currents dominated by the W&S elements not the switches. The W&S elements are n-MOS transistors 21A and 21 B, 2 μm/0.8 μm. The resetting switches are n-MOS transistors 23A and 23B, 2 μm/0.8 μm. The capacitors are MOS capacitors 22A and 22B, both 40 pF. The width of the linear-weighting W&S signal is 59 ns, corresponding to n=59. The maximum differential output sample voltage is around 100 mV. FIG. 12B shows the theoretical frequency response in solid line and the HSPICE® simulated frequency response in dots for $f_{in}=900$–1100 MHZ. The simulated frequency response is basically in accordance with the theoretical frequency response. Both have $\Delta f_{3dB}=2$ MHZ. For the implementation 24, however, the maximum adjacent peak is −30 dB, lower than that of the theoretical response. This is because the conductance of n-MOS transistors 21A or 21B does not vary linearly with the linear W&S signal. The actual weighting function is somewhere between linear and Gauss.

Figure 13A:
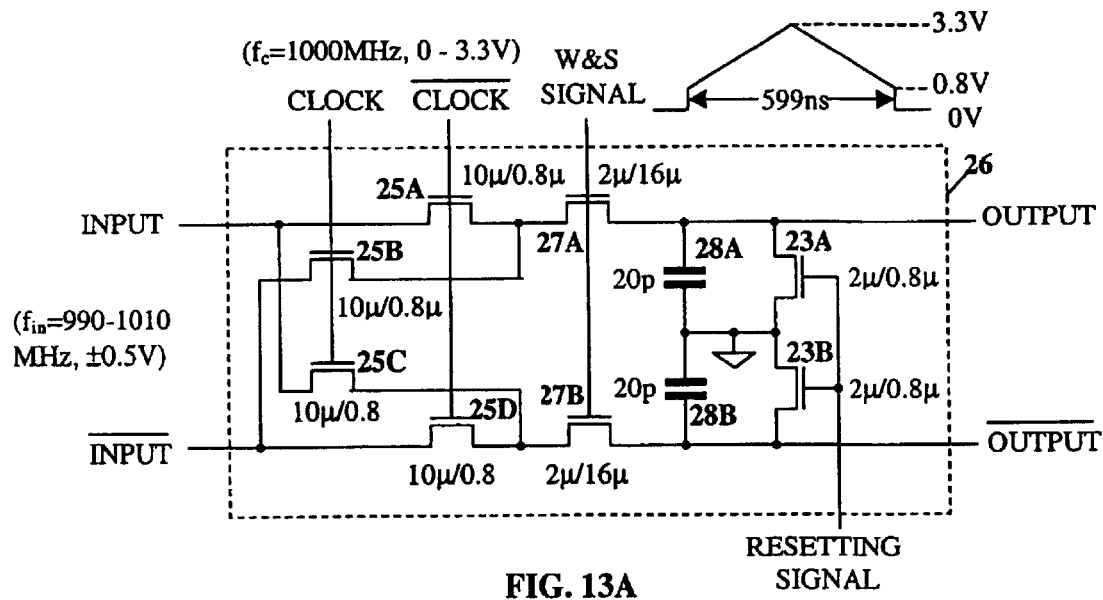
FIG. 13A is the circuit diagram according to FIG. 10 with n=599 in linear weighting at 1000 MHz.
Figure 13B:
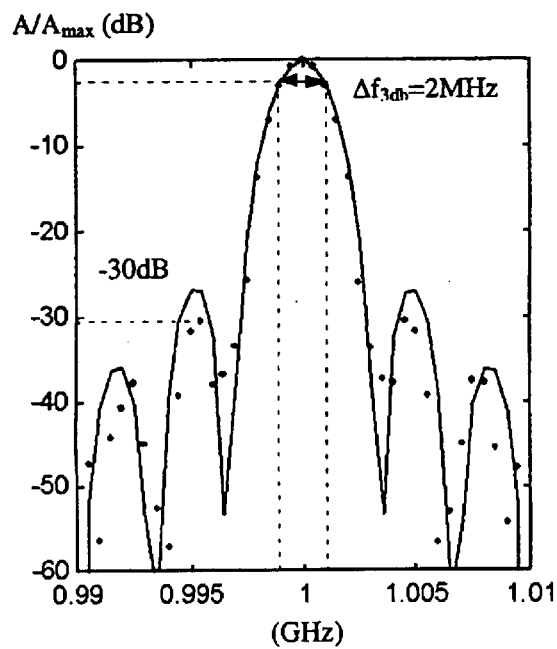
FIG. 13B is the resulting frequency response of the circuit in FIG. 13A.

An implementation 26 with n=599 in linear weighting at $f_c=1000$ MHZ is shown in FIG. 13A. The clocked switches are n-MOS transistors 25A, 25B, 25C and 25D, 10 μm/0.8 μm. The W&S elements are n-MOS transistors 27A and 27B, 2 μm/16 μm. Note that the lengths of 27A and 27B are increased to 16 μm to limit the signal current and the capacitor voltage dung such a long charging period (599 ns). The resetting switches are n-MOS transistors 23A and 23B, 2 μm/0.8 μm. The capacitors are MOS capacitors 28A and 28B, both 20 pF. The width of the linear weighting W&S signal is 599 ns, corresponding to n=599. The maximum differential output sample voltage is around 100 mV. FIG. 13B shows the theoretical frequency response in solid line and the HSPICE® simulated frequency response in dots for $f_{in}=990$–1010 MHZ. The simulated frequency response is basically in accordance with the theoretical frequency response. Both have $\Delta f_{3dB}=2$ MHZ. For the same reason mentioned above, the maximum adjacent peak of the implementation 26 is −30 dB, lower than that of the theoretical response.

Figure 14A:
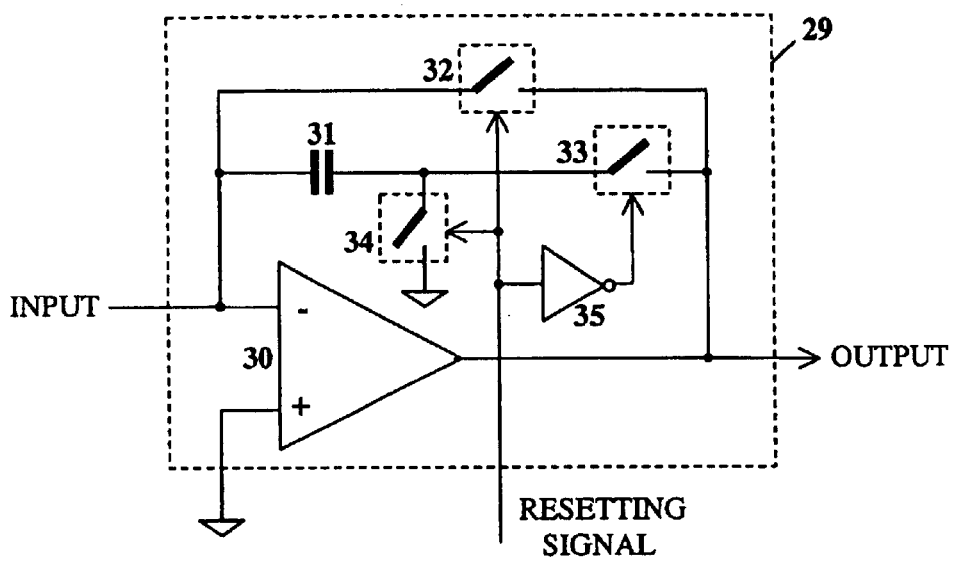
FIG. 14A is a circuit diagram of a single ended active integrator.
Figure 14B:
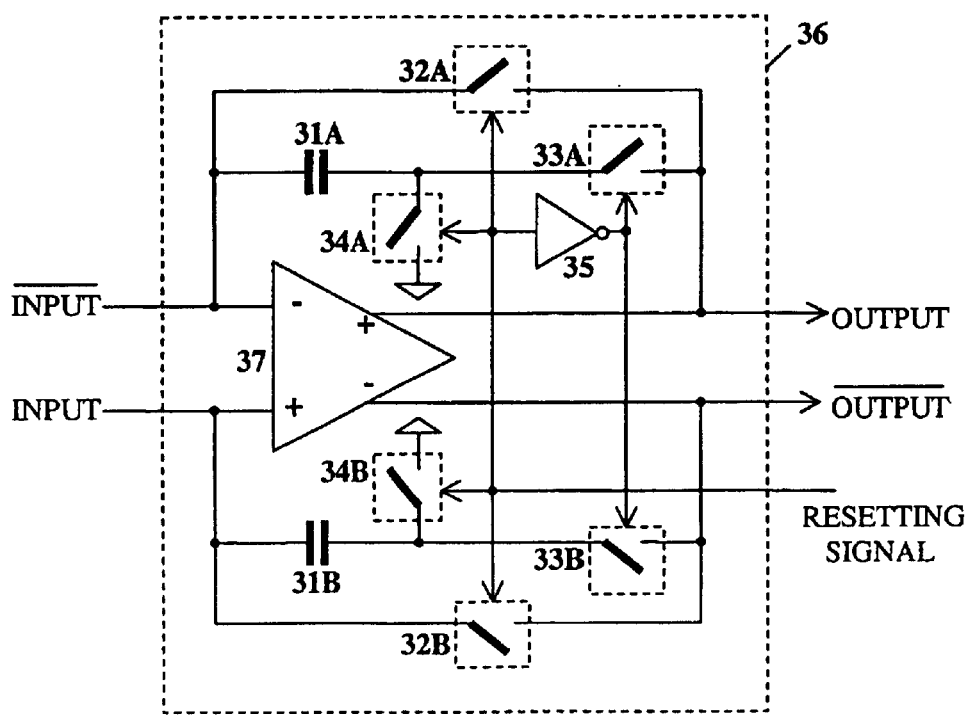
FIG. 14B is a circuit diagram of a differential active integrator.

FIG. 14A and FIG. 14B show active integrators for improving output swing and linearity, respectively. A single ended active integrator 29 is shown in FIG. 14A. It comprises a differential-in-single-out amplifier 30, an inverter 35, a capacitor 31, and switches 32, 33 and 34, as connected. An active integrator always keeps the signal input at virtual ground, eliminating the impact of capacitor voltage on the signal current. The bandwidth of amplifier 30 needs only to cover the signal base-band not the carrier, which makes it feasible. The inverter 35 produces an inverted resetting signal with a delay, using the resetting signal as the input, to control the switch 33 while the resetting signal controls the switches 32 and 34. During the resetting phase, the switches 32 and 34 are turned on, and the switch 33 it turned off. The voltage of capacitor 31 is reset to the input offset voltage of the amplifier 30. During the sampling phase, the switches 32 and 34 are turned off and the switch 33 is turned on. The capacitor 31 is charged by the signal current. In the same time, the offset voltage of the amplifier 30 is cancelled. A differential active integrator 36 is shown in FIG. 14B. It comprises a differential-in-differential-out amplifier 37, two capacitors 31A and 31B, an inverter 35, and switches 32A, 32B, 33A, 33B, 34A and 34B. It works basically in the same way as the integrator 29 except uses a differential input signal and gives differential outputs. The integrator 29 can replace the integrator 3 in FIG. 1A while the integrator 36 can replace the integrator 10 in FIG. 3.

Figure 15:
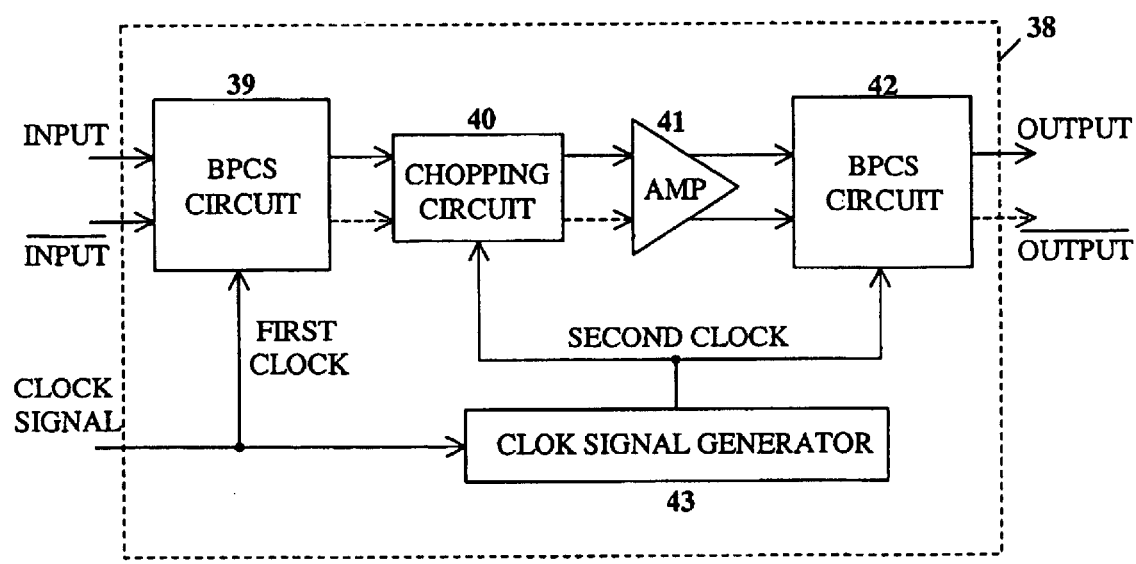
FIG. 15 is a block diagram of a two-step BPCS circuit.

FIG. 15 shows a two-step BPCS circuit 38. It comprises a first BPCS circuit 39, a chopping circuit 40, an amplifier 41, a second BPCS circuit 42, and a clock signal generator 43 generating a second clock. The first BPCS circuit 39 and the second BPCS circuit 42 can be any type of the BPCS circuits 5, 8, 11, 19, 24 and 26. To the first BPCS circuit 39, two ends of a differential analog signal are applied to its two inputs respectively, and a first clock is applied to its clock input. Signal samples with a first sample rate are produced from the first BPCS circuit 39 and fed to the chopping circuit 40. The samples are chopped symmetrically in time, controlled by the second clock. From the chopping circuit 40, the chopped signal with a new carrier frequency equal to the chopping frequency is fed to the amplifier 41, and the amplified differential signals are fed to two inputs of second BPCS circuit 42 respectively. Controlled by the second clock, the second BPCS circuit 42 produces the final sample output with a second sample rate. The two-step BPCS circuit 38 gives flexibility in performance trade-off. BPCS circuits in more steps can be built based on the two-step BPCS circuit 38.

Figure 16:
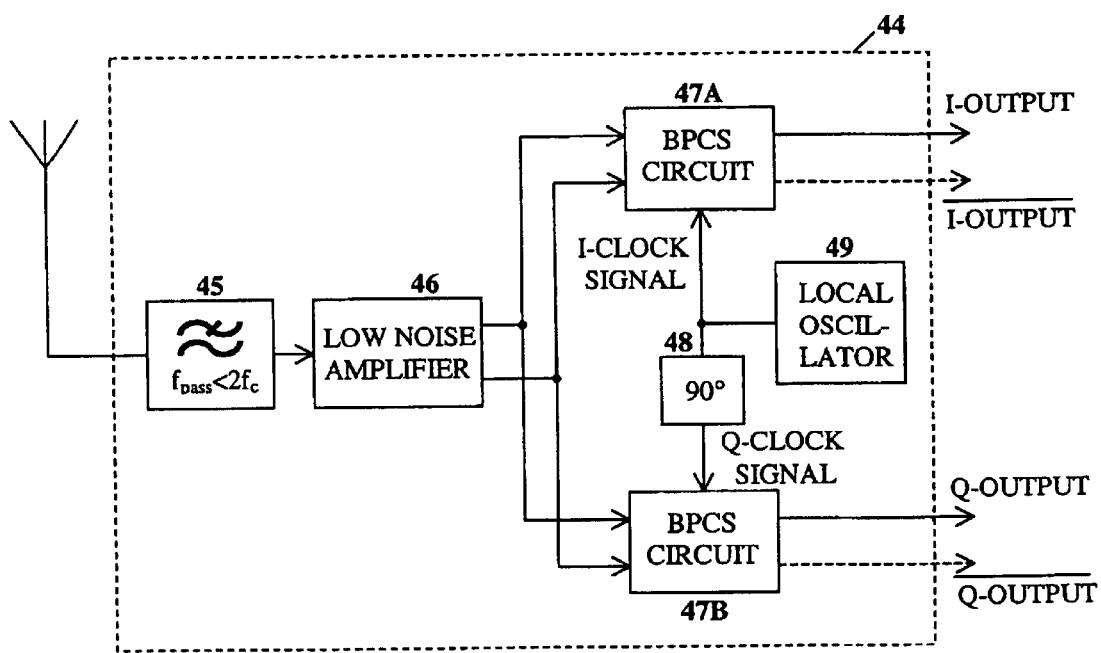
FIG. 16 is a block diagram of a front-end sampling radio receiver architecture.

A front-end sampling radio receiver architecture 44 is shown in FIG. 16. It comprises a low pass filter 45 with $f_{pass} < 2f_c$, a differential-out low noise amplifier (LNA) 46, two BPCS circuits 47A and 47B, a 90° phase shifter 48, and a local oscillator 49. The radio signal from antenna is applied to the input of the low pass filter 45. The frequency components above $2f_c$ are greatly attenuated. The output of the low pass filter 45 is fed to the LNA 46 to produce differential outputs with a large enough amplitude. The differential outputs are fed to the inputs of BPCS circuits 47A and 47B simultaneously. In the same time, the I-clock signal produced by the local oscillator 49 is fed to the BPCS circuit 47A while the Q-clock signal reproduced by the 90° phase shifter 48 from the I-clock signal is fed to the BPCS circuit 47B. The BPCS circuits 47A and 47B produce I-samples and Q-samples respectively. The sample outputs can be either converted to digital data immediately or further treated. The BPCS circuits 47A and 47B can be any of the BPCS circuits 5, 8, 11, 19, 24 and 26. The integrators in these circuits can be either passive integrators or active integrators. The radio receiver architecture 44 has filtering, mixing and sampling functions simultaneously at the front-end, which relaxes the performance demands on A/D conversion, avoids analog filters, and highly utilizes the capability of DSP. In principle, any narrow bandwidth, i.e. any high Q value, is possible. The center frequency of the filtering function can be easily programmed. It is indeed a superior radio receiver architecture with a wide application scope.

The sampling capacitors used in the CS and the BPCS circuits are much larger than that used in a voltage sampling circuit, resulting in low noise and low charge and clock feed-through.

The BPCS circuit is simultaneously a filter, a mixer and a sampler, capable of working at radio frequencies. The center frequency, the bandwidth and the adjacent selectivity can be set by the clock frequency, the number n and the shape of W&S signal, particularly useful for front-end sampling radio receiver and system-on-chip.

It is to be understood that even though numerous characteristics and features of the present invention have been set forth in the description, together with details of the function of the invention, the disclosure is illustrative only and changes may be made in detail within the scope of the invention defined by the following claims.

What is claimed is:

1. A charge sampling circuit, comprising:
   a control signal generator for controlling an analog input signal to the charge sampling circuit; and
   an active integrator for integrating directly the analog input signal during a sampling phase responsive to a sampling signal from the control signal generator, wherein a current of the analog input signal is integrated to an integrated charge for producing one of a proportional voltage sample and a proportional current sample at a signal output upon completion of the sampling phase.

2. The charge sampling circuit according to claim 1, further comprising:
   a sampling switch having a signal input for analog input signals, a signal output connected to a signal input of said active integrator, and a control input connected to a sampling signal output of said control signal generator for controlling the switch to be on only when said sampling signal from the generator is in a sampling phase.

3. The charge sampling circuit according to claim 1, wherein the control signal generator controls the active integrator to hold the sample until a resetting signal from the generator is applied to a control input of the integrator.

4. A charge sampling circuit, comprising:
   a control signal generator for controlling an analog input signal to the charge sampling circuit; and
   an integrator for integrating directly the analog input signal during a sampling phase responsive to a sampling signal from the control signal generator, wherein a current of the analog input signal is integrated to an integrated charge for producing one of a proportional voltage sample and a proportional current sample at a signal output upon completion of the sampling phase, wherein if said sampling phase is from time $t_1$ to time $t_2$, said sample represents the instant value of said analog signal at time $t_s = (t_1 + t_2)/2$ and differs from said instant value with a coefficient comprising a constant part and a frequency dependent part $(\sin(2\pi f_i \Delta t))/(2\pi f_i \Delta t)$, where $f_i$ is the frequency of the ith component of said analog signal and $\Delta t = (t_2 - t_1)/2$.

5. A differential charge sampling circuit, comprising:
   a first charge sampling circuit having a first active integrator,
   a second charge sampling circuit having a second active integrator, a first analog input being a signal input of the second charge sampling circuit;

a second analog input being a signal input of the second charge sampling circuit;

a first signal outpu being a signal output of the first charge sampling circuit;

a second signal output being a signal output of said second charge sampling circuit; and a common control signal generator for controlling an analog input signal provided to the first and second analog inputs, wherein the first and second active integrators integrate a respective portion of the analog input signal during a sampling phase responsive to a sampling signal from the common control signal generator.

6. The differential charge sampling circuit according to claim 5, wherein the first active integrator and the second active integrator form a single differential active integrator having two inputs for integrating a differential current of said analog signal and for producing differential samples at said first signal output and at the second signal output of the differential charge sampling circuit.

7. A band-pass charge sampling circuit, comprising:

a control signal generator for controlling a first and second portion of a differential analog signal;

a first signal input for receiving the first portion of the differential analog signal;

a second signal input for receiving the second portion of the differential analog signal;

an integrator; and a weighting-and-sampling element for processing the differential analog signal during a weighting-and-sampling phase responsive to a weighting-and-sampling signal from said control signal generator, wherein a current of said differential analog signal passes through said weighting-and-sampling element only when said weighting-and-sampling signal is in a weighting-and-sampling phase, said control signal generator for controlling an output signal of said weighting-and-sampling element to be integrated by the integrator during said weighting-and-sampling phase, and a current of the output signal of said weighting-and-sampling element is integrated to an integrated charge for producing one of a proportional voltage sample and a proportional current sample at a signal output upon completion of said weighting-and-sampling phase.

8. The band-pass charge sampling circuit according to claim 7, further comprising:

a first switch having a signal input coupled to the first signal input of the band-pass charge sampling circuit for receiving the first portion of the differential analog signal, a signal output connected to a signal input of said weighting-and-sampling element, and a control input connected to a clock output of said control signal generator for controlling the first switch to be on only when a first clock signal is received; and a second switch having a signal input coupled to the second signal input of the band-pass charge sampling circuit for receiving the second portion of the differential analog signal, a signal output connected to said signal input of said weighting-and-sampling element, and a control input connected to an inverse clock output of said control signal generator for controlling the switch to be on only when a second clock signal is received, wherein said weighting-and-sampling element includes a control input connected to a weighting-and-sampling signal output of said control signal generator whereby the current of said analog signal passes through said weighting-and-sampling element only when said weighting-and-sampling signal is in a weighting-and-sampling phase containing a number of cycles, n, of the first and second clock signals, the current of said analog signal is controlled by said weighting-and-sampling signal using one of a constant, a linear, and a Gaussian weighting function, and the integrator includes a control input connected to a resetting signal output of said control signal generator.

9. The band-pass charge sampling circuit according to claim 7, wherein the control signal generator controls the integrator to hold the sample until a resetting phase controlled by said resetting signal begins.

10. The band-pass charge sampling circuit according to claim 7, wherein said samples represent a base-band content of said analog signal, and the output frequency is $f_{out}=|f_{in}-(2p-1)f_c|$ for $2(p-1)f_c \leq f_{in} \leq 2pf_c$, where $f_{in}$ is one of a plurality of frequency components of said analog signal, $f_c$ is a frequency of said clock, and p is an integer greater than or equal to 1, and a phase of said output frequency depends on a phase of said $f_{in}$ and a phase of said $f_c$, wherein p=1 defines a major frequency response range and the same shape of frequency response is repeated for p>1 but the amplitudes are reduced, and for a given p, the same output frequency is obtained for frequencies $f_{in1}<(2p-1)f_c$ and $f_{in2}>(2p-1)f_c$ when $(2p-1)f_{c-fin1}=f_{in2}-(2p-1)f_c$ but with different phases, and the bandwidth and the shape of said frequency response depend on said number of cycles, n, the larger n the narrower the bandwidth, and said weighting function and said band-pass charge sampling circuit operate simultaneously as a filter, a mixer and a sampler.

11. The band-pass charge sampling circuit of claim 7, wherein the band-pass charge sampling circuit is a first of two band-pass charge sampling circuits included in a two-step band-pass charge sampling circuit, the first band-pass charge sampling circuit for producing signal samples at the signal output or output pair of said first band-pass charge sampling circuit with a first sample rate, the two-step band-pass charge sampling circuit comprising:

a chopping circuit for chopping the signal from the first band-pass charge sampling circuit symmetrically in time at its signal output or output pair with the frequency of a clock signal equal to said first sample rate; and a differential-out amplifier for amplifying the signal from the chopping circuit differentially at its signal output pair;

wherein the first signal input and the second signal input of a second band-pass charge sampling circuit are connected to the signal output pair of said amplifier for producing signal samples at the signal output or output pair with a second sample rate.

12. The band-pass charge sampling circuit of claim 11, wherein the two-step band-pass charge sampling circuit comprises:

a clock signal generator having a clock input for receiving a first clock signal used by the first band-pass charge sampling circuit, and generating a second clock signal simultaneously fed to a clock input of said chopping circuit and a clock input of said second band-pass charge sampling circuit.

13. The band-pass charge sampling circuit of claim 7, wherein the band-pass charge sampling circuit is a first of two band-pass charge sampling circuits included in a front-end sampling radio receiver apparatus, the apparatus comprising:
- a low pass filter for receiving and filtering a radio signal, the low pass filter having a bandwidth up to twice a clock frequency associated with the band-pass charge sampling circuits;
- a low noise amplifier for producing a differentially amplified radio signal from the filtered signal;
- a local oscillator for producing an I-clock signal at its signal outpu; and
- a π/2 phase shifter with a signal input connected to the local oscillator for producing a Q-clock signal at its signal output with the same amplitude and π/2 phase shift with respect to said I-clock signal;
- wherein two ends of the signal output pair of said low noise amplifier are respectively connecte both to the first band-pass charge sampling circuit and to a second band-pass charge sampling circuit respectively, said I-clock signal output is connected to the clock input of said first band-pass charge sampling circuit, and said Q-clock signal output is connected to the clock input of said second band-pass charge sampling circuit, for producing base-band I-samples of said radio signal at the signal outpu or output pair of said first band-pass charge sampling circuit, base-band Q samples of said radio signal at the signal output or output pair of said second band-pass charge sampling circuit.

14. The band-pass charge sampling circuit of claim 13, wherein:
- the local oscillator, the phase shifter and the clock generators of the first and second band-pass charge sampling circuits are combined for producing differential T-clock signals and Q-clock signals;
- the base-band I-sample and Q-samples are converted by one of two separate analog-to-digital converters or by a single analog-to-digital converter with multiplexing to digital signals; and
- the digital signals are processed by a digital signal processing unit.

15. A differential band-pass charge sampling circuit, comprising:
- a common control signal generator for controlling a first and second portion of a differential analog signal;
- a first band-pass charge sampling circuit, having
  - a first signal input operating as a first signal input of the differential band-pass charge sampling circuit for receiving the first portion of the differential analog signal,
  - a second signal input operating as a second signal input of the differential band-pass charge sampling circuit for receiving the second portion of the differential analog signal,
  - a first integrator having an output operating as a first signal output of the differential band-pass charge sampling circuit, and
  - a first weighting-and-sampling element coupled to the first integrator; and a second band-pass charge sampling circuit, having
  - a first signal input coupled to the second input of the first band-pass charge sampling circuit,
  - a second signal input coupled to the first input of the first band-pass charge sampling circuit,
  - a second integrator having an output operating as a second signal output of the differential band-pass charge sampling circuit, and
  - a second weighting-and-sampling element coupled to the second integrator, wherein the first and second weighting-and-sampling elements process the differential analog signal during a weighting-and-sampling phase responsive to a weighting-and-sampling signal from said control signal generator, a current of said differential analog signal passes through said weighting-and-sampling elements only when said weighting-and-sampling signal is in a weighting-and-sampling phase, said control signal generator is adapted for controlling an output signal of each first and second weighting-and-sampling elements to be integrated by the respective first and second integrators during said weighting-and-sampling phase, and a current of each output signal of the first and second weighting-and-sampling elements is integrated to an integrated charge for producing one of a proportional voltage sample and a proportional current sample at the respective first and second signal outputs of the differential band-pass charge sampling circuit upon completion of said weighting-and-sampling phase.

16. The differential band-pass charge sampling circuit according to claim 15, wherein the first and second integrators form a single differential integrator for integrating the differential current of said analog signal and for producing differential samples at the first signal output and the second signal output of the differential band-pass charge sampling circuit.

17. A parallel charge sampling circuit, comprising:
- a common control signal generator; and
- a plurality of charge sampling circuits, each respective charge sampling circuit having
  - a first analog input being a signal input of the respective charge sampling circuit and responsive to a controlling signal from the common control signal generator; and
  - an integrator for integrating the analog input signal during a sampling phase responsive to a sampling signal from the common control signal generator;
- wherein all analog first signal inputs are connected together as a common analog signal input of said parallel charge sampling circuit, a multiplexer having a plurality of signal inputs connected to the signal outputs of said charge sampling circuits respectively, control inputs connected to multiplexing signal outputs of said common control signal generator, and a signal output for multiplexing the outputs of said charge sampling circuits to the output of said parallel charge sampling circuit when the outputs of said charge sampling circuits are in holding phases.

18. The parallel charge sampling circuit according to claim 17, wherein said common control signal generator has a clock input, a plurality of sampling signal outputs, a plurality of resetting signal outputs, and a plurality of multiplexing signal outputs for generating said plurality of sampling signals at the sampling signal outputs connected to the control inputs of the switches of said charge sampling circuits respectively, and for generating said plurality of resetting signals at said resetting signal outputs connected to the control inputs of the integrators of the charge sampling circuits respectively, and said plurality of multiplexing signals are generated at the multiplexing signal outputs, and said resetting signals, said sampling signals and said multiplexing signals are evenly timeinterleaved.

19. A differential parallel charge sampling circuit, comprising a number of differential charge sampling circuits each having a differential charge sampling circuit, comprising:
- a first charge sampling circuit having a first integrator;

a second charge sampling circuit having a second integrator;

a first analog input being a signal input of the first charge sampling circuit;

a second analog input being a signal input of the second charge sampling circuit;

a first signal output being a signal output of the first charge sampling circuit;

a second signal output being a signal output of said second charge sampling circuit; and a common control signal generator for controlling an analog input signal provided to the first and second analog inputs, wherein all first inputs are connected together as a common first signal input of said parallel charge sampling circuit for receiving a first end of a differential analog signal, all second inputs are connected together as a common second signal input of said parallel charge sampling circuit for receiving a second end of said differential analog signal, and all control signal generators of said charge sampling circuits are replaced by a common control signal generator, a multiplexer having a plurality of signal input pairs connected to the signal output pairs of said charge sampling circuits respectively, control inputs connected to multiplexing signal outputs of said common control signal generator, and a signal output pair for multiplexing the output pairs of said charge sampling circuits to the output pair of said parallel charge sampling circuit when the output pairs of said charge sampling circuits are in holding phases.

20. A parallel band-pass charge sampling circuit comprising a plurality of band-pass charge sampling circuits each having band-pass charge sampling circuit, comprising:

a control signal generator for controlling a first and second portion of a differential analog signal;

a first signal input for receiving the first portion of the differential analog signal;

a second signal input for receiving the second portion of the differential analog signal;

an integrator; and a weighting-and-sampling element for processing the differential analog signal during a weighting-and-sampling phase responsive to a weighting-and-sampling signal from said control signal generator, wherein all first signal inputs are connected together as a common signal input of said parallel band-pass charge sampling circuit for receiving a first end of a differential analog signal, all second signal inputs are connected together as a common second signal input of said parallel band-pass charge sampling circuit for receiving a second end of a differential analog signal, the first switches are one of separate and merged, the second switches are one of separate and merged, and all control signal generators in said band-pass charge sampling circuits are replaced by a common control signal generator, and a multiplexer having a plurality of signal inputs connected to the signal outputs of said band-pass charge sampling circuits, control inputs connected to multiplexing signal outputs of said common control signal generator, and a signal output for multiplexing the outputs of said band-pass charge sampling circuits to the signal output when the signal outputs of said band-pass charge sampling circuits are in holding phases, whereby the signal output is the signal output of said parallel band-pass charge sampling circuit.

21. A parallel band-pass charge sampling circuit comprising a plurality of band-pass charge sampling each having:

a common control signal generator for controlling a first and second portion of a differential analog signal;

a first band-pass charge sampling circuit, having
a first signal input operating as a first signal input of the differential band-pass charge sampling circuit for receiving the first portion of the differential analog signal,
a second signal input operating as a second signal input of the differential band-pass charge sampling circuit for receiving the second portion of the differential analog signal,
a first integrator having an output operating as a first signal output of the differential band-pass charge sampling circuit, and
a first weighting-and-sampling element coupled to the first integrator; and a second band-pass charge sampling circuit, having
a first signal input coupled to the second input of the first band-pass charge sampling circuit,
a second signal input coupled to the first input of the first band-pass charge sampling circuit,
a second integrator having an output operating as a second signal output of the differential band-pass charge sampling circuit, and
a second weighting-and-sampling element coupled to the second integrator;

wherein all first signal inputs are connected together as a common first signal input of said parallel band-pass charge sampling circuit for receiving a first end of a differential analog signal, all second signal inputs are connected together as a common second signal input of said parallel band-pass charge sampling circuit for receiving a second end of a differential analog signal, all the first switches in said first band-pass charge sampling circuits are one of separate and merged, all the second switches in said first band-pass charge sampling circuits are one of separate and merged, all the first switches in said second band-pass charge sampling circuits are one of separate and merged, all the second switches in said second band-pass charge sampling circuits are one of separate and merged, all control signal generators of said band-pass charge sampling circuits are replaced by a common control signal generator, and a multiplexer with said number of signal input pairs connected to the signal output pairs of said band-pass charge sampling circuits, control inputs connected to multiplexing signal outputs of said common control signal generator, and an output pair for multiplexing the output pairs of said band-pass charge sampling circuits to the signal output pair when the signal output pairs of said band-pass charge sampling circuits are in holding phases, whereby the signal output pair is the signal output pair of said parallel band-pass charge sampling circuit.

22. The parallel band-pass charge sampling circuit of claim 21, wherein the common control signal generator includes a clock input, a clock output, an inverse clock output, a plurality of weighting-and-sampling signal outputs, a plurality of resetting signal outputs and a plurality of multiplexing signal outputs, whereby the clock input is the clock input of said parallel band-pass charge sampling circuit for use in generating a clock signal at the clock output of said common signal control generator connected to the control inputs of all first switches of said band-pass charge sampling circuits, and an inverse clock at the inverse clock output connected to the control inputs of all second switches of said band-pass charge sampling circuits, said plurality of weighting-and-sampling signal outputs are connected to the control inputs of all weighting-and-sampling elements of said bandpass charge sampling circuits, said plurality of resetting signal outputs are connected to the control inputs of all integrators of said band-pass charge sampling circuits, and said plurality of multiplexing signals, resetting signals, sampling signals, and multiplexing signals are evenly timeinterleaved.

23. A charge sampling circuit, comprising:
a control signal generator for controlling an analog input signal to the charge sampling circuit;
an integrator for integrating directly the analog input signal during a sampling phase responsive to a sampling signal from the control signal generator, wherein a current of the analog input signal is integrated to an integrated charge for producing one of a proportional voltage sample and a proportional current sample at a signal output upon completion of the sampling phase; and
an analog frequency compensating circuit having a signal input for receiving an analog signal, and a signal output, with a frequency response proportional to $(2\pi f_i \Delta t)/(\sin(2\pi f_i \Delta t))$, wherein the signal output pair is connected to the signal input of said charge sampling circuit.

24. A differential charge sampling circuit, comprising:
a first charge sampling circuit having a first integrator;
a second charge sampling circuit having a second integrator;
a first analog input being a signal input of the first charge sampling circuit;
a second analog input being a signal input of the second charge sampling circuit;
a first signal output being a signal output of the first charge sampling circuit;
a second signal output being a signal output of said second charge sampling circuit;
a common control signal generator for controlling an analog input signal provided to the first and second analog inputs, wherein the first and second integrators integrate a respective portion of the analog input signal during a sampling phase responsive to a sampling signal from the common control signal generator; and
an analog frequency compensating circuit having a signal input pair for receiving an analog signal, and a signal output pair, with a frequency response proportional to $(2\pi f_i \Delta t)/(\sin(2\pi f_i \Delta t))$, wherein the signal output pair is connected to the first signal input and the second signal of said charge sampling circuit.

25. A charge sampling, comprising:
a control signal generator for controlling an analog input signal to the charge sampling circuit;
an integrator for integrating directly the analog input signal during a sampling phase responsive to a sampling signal from the control signal generator, wherein a current of the analog input signal is integrated to an integrated charge for producing one of a proportional voltage sample and a proportional current sample at a signal output upon completion of the sampling phase; and
a digital frequency compensating circuit with a frequency response proportional to $(2\pi f_i \Delta t)/(\sin(2\pi f_i \Delta t))$ connected after an A/D converter converting the signal output of said charge sampling circuits to a digital signal.

26. A differential charge sampling circuit, comprising:
a first charge sampling circuit having a first active integrator;
a second charge sampling circuit having a second active integrator;
a first analog input being a signal input of the first charge sampling circuit;
a second analog input being a signal input of the second charge sampling circuit;
a first signal output being a signal output of the first charge sampling circuit;
a second signal output being a signal output of said second charge sampling circuit;
a common control signal generator for controlling an analog input signal provided to the first and second analog inputs, wherein the first and second active integrators integrate a respective portion of the analog input signal during a sampling phase responsive to a sampling signal from the common control signal generator; and
a digital frequency compensating circuit with a frequency response proportional to $(2\pi f_i \Delta t)/(\sin(2\pi f_i \Delta t))$ connected after an A/D converter converting the signal output pair of said charge sampling circuits to a digital signal.

27. A method of charge sampling, comprising the steps of:
using an active integrator to integrate directly an analog input signal during a sampling phase, wherein the current of the analog input signal is integrated to an integrated charge; and
producing one of a proportional voltage and a proportional current sample of said integrated charge at the end of said sampling phase.

28. The method according to claim 27, wherein said analog input signal is differential analog signal, and said one of a proportional voltage and a proportional current sample of said integrated charge is a differential signal.

29. A method of charge sampling, comprising the steps of:
integrating directly an analog input signal during a sampling phase, wherein the current of the analog input signal is integrated to an integrated charge; and
producing one of a proportional voltage and a proportional current sample of said integrated charge at the end of said sampling phase,
wherein if said sampling phase is from time $t_5=(t_1+t_2)/2$ and differs from said instant value with a coefficient consisting of a constant part and a frequency dependent part $(\sin(2\pi F_i \Delta t))/(2\pi f_i \Delta t)$, where $f_i$ is the frequency of the ith component of said analog signal and $t=(T_2-t_1)/2$.

30. A method of charge sampling, comprising the steps of:
weighting a first and second end of a differential analog signal during a weighting-and-sampling phase;
integrating the weighted signal during said weighting-and-sampling phase, wherein the current of the weighted signal is integrated to an integrated charge, and
producing one of a proportional voltage and a proportional current sample at the end of said weighting-and-sampling phase.

* * * * *

UNITED STATES PATENT AND TRADEMARK OFFICE
CERTIFICATE OF CORRECTION

PATENT NO.        : 7,053,673 B1
APPLICATION NO. : 09/672803
DATED             : May 30, 2006
INVENTOR(S)       : Jiren Yuan It is certified that error appears in the above-identified patent and that said Letters Patent is hereby corrected as shown below:

Column 5, Line 3: Change "$Q_1=(2\sin(\omega_1\Delta\omega_i))l_i \sin$" to -- $Q_1=(2\sin(\omega_1\Delta t/\omega_i))l_i \sin$ --

Column 5, Line 15: Change "GHZ" to --GHz--

Column 6, Line 60: Change "$n\leq 10$" to --n=10--

Col. 11, Line 1: Change "of the sceond" to --of the first--

Col. 11, Line 5: Change "outpu" to --output--

Col 12, Line 31: Change "when $(2p-1)f_{c\text{-}fin1}=f_{in2}-(2p-1)f_c$" to --when $(2p-1)f_c-f_{in1}=f_{in2}-(2p-1)f_c$--

Col. 13, Line 11: Change "outpu;" to --output;--

Col. 13, Line 17: Change "connecte" to --connected--

Col. 13, Line 25: Change "the signal outpu" to --the signal output--

Col 13, Line 33: Change "T-clock" to --1-clock--

Col. 14, Line 63: Change "sampling circuit," to --sampling circuit--

Col. 14, Line 64: Change "sampling circuits" to --sampling circuits,--

Col. 14, Line 65: Change "each having a differential charge sampling circuit," to --each differential charge sampling circuit--

Col. 15, Line 13: Change "analog inputs," to --analog inputs;--

Col. 17, Line 2: Change "bandpass" to --band-pass--

Col. 17, Line 22: Change "output pair is" to --output is--

Col. 17, Line 49: Change "A charge sampling," to --A charge sampling circuit,--

UNITED STATES PATENT AND TRADEMARK OFFICE
CERTIFICATE OF CORRECTION

PATENT NO. : 7,053,673 B1
APPLICATION NO. : 09/672803
DATED : May 30, 2006
INVENTOR(S) : Jiren Yuan It is certified that error appears in the above-identified patent and that said Letters Patent is hereby corrected as shown below:

Col. 18, lines 2-3: Change "a first active integrator;" to --a first integrator;--

Col. 18, lines 4-5: Change "a second active integrator," to --a second integrator;--

Col. 18, lines 45-46: Change "is from time $t_5==(t_1+t_2)/2$ and" to --is from time $t_1$ to time $t_2$, said sample represents the instant value of said analog signal at time $t_s-(t_1+t_2)/2$ and--

Col. 18 line 50: Change "$t==(T_2-t_1)/2$." to --$t=(t_2-t_1)/2$.--

Signed and Sealed this

Ninth Day of January, 2007

JON W. DUDAS
*Director of the United States Patent and Trademark Office*